(12) United States Patent
Hirai

(10) Patent No.: US 6,587,370 B2
(45) Date of Patent: Jul. 1, 2003

(54) MAGNETIC MEMORY AND INFORMATION RECORDING AND REPRODUCING METHOD THEREFOR

(75) Inventor: Tadahiko Hirai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,721

(22) Filed: Oct. 31, 2001

(65) Prior Publication Data

US 2002/0057594 A1 May 16, 2002

(30) Foreign Application Priority Data

| Nov. 1, 2000 | (JP) | 2000-334491 |
| Nov. 1, 2000 | (JP) | 2000-334492 |
| Nov. 30, 2000 | (JP) | 2000-365105 |

(51) Int. Cl.$^7$ .............................................. G11C 11/14
(52) U.S. Cl. ..................... 365/171; 365/173; 365/158; 365/209; 365/225.5
(58) Field of Search ................. 365/171, 173, 365/158, 209, 225.5

(56) References Cited

U.S. PATENT DOCUMENTS

| 4,829,476 A | 5/1989 | Dupuis et al. ............... 365/158 |
| 5,420,819 A | 5/1995 | Pohm ........................ 365/158 |
| 5,448,515 A | 9/1995 | Fukami et al. ............... 365/171 |
| 5,699,293 A | 12/1997 | Tehrani et al. .............. 365/158 |
| 6,055,178 A | 4/2000 | Naji ........................ 365/158 |
| 6,055,179 A * | 4/2000 | Koganei et al. ............. 365/158 |
| 6,069,820 A * | 5/2000 | Inomata et al. ............. 365/171 |
| 6,111,781 A * | 8/2000 | Naji ........................ 365/158 |
| 6,381,170 B1 * | 4/2002 | Prinz ....................... 365/129 |

OTHER PUBLICATIONS

Scheuerlein, R.E., "Magneto–Resistive IC Memory Limitations and Architecture Implications," 1998 Int'l. NonVolatile Memory Technology Conference, pp. 47–50, IEEE, 0–7803–4518–5/98.

* cited by examiner

Primary Examiner—Michael S. Lebentritt
Assistant Examiner—Toan Le
(74) Attorney, Agent, or Firm—Fitzpatrick, Cella, Harper & Scinto

(57) ABSTRACT

An information recording and reproducing method for a magnetic memory including a variable resistor having a first magnetic layer for storing information on a basis of a direction of magnetization, a non-magnetic layer, and a second magnetic layer having a coercive force that is smaller than a coercive force of the first magnetic layer, the variable resistor exhibiting different resistances according to magnetization directions of the first magnetic layer and the second magnetic layer, the information recording and reproducing method including the steps of: initializing the second magnetic layer in a first magnetization direction; detecting a resistance value of the variable resistor and holding the detected resistance value as a first resistance value; detecting a second resistance value by reversing magnetization of the second magnetization layer in a second magnetization direction and comparing the first resistance value with the second resistance value; and reproducing information according to a result of the comparison.

44 Claims, 27 Drawing Sheets

MAGNETIC FIELD H'

MAGNETIC MEMORY AND INFORMATION RECORDING AND REPRODUCING METHOD THEREFOR

BACKGROUND OF THE INVENTION

1. Field of the Invention

The present invention relates to a memory for storing information, and more particularly, to a nonvolatile memory using a magneto-resistance effect element and an information recording and reproducing method therefor.

2. Related Background Art

Generally, magnetic substances, such as ferromagnetic substances and ferrimagnetic substances, have a characteristic that magnetization caused by magnetic fields applied from the outside resides even after the external magnetic fields are removed (this residing magnetization is called the "residual magnetization"). These substances are hereinafter collectively referred to as the "magnetic substances". Also, the electrical resistances of these magnetic substances change according to the direction of magnetization and the presence or absence of magnetization. This phenomenon is called the "magneto-resistance effect". Also, the changing rate of an electrical resistance value is called the "magneto-resistance ratio (MR ratio)". As a material having a high MR ratio, there have been known giant magneto-resistance (GMR) materials and colossal magneto-resistance (CMR) materials that are metals, alloys, or oxide complexes. For instance, Fe, Ni, Co, Gd, Tb, alloys thereof, and $La_xSr_{1-x}MnO_9$ and $La_xCa_{1-x}MnO_9$ that are oxide complexes are used as the GMR materials and CMR materials. By utilizing the residual magnetization of the magneto-resistance materials, it is possible to construct a nonvolatile memory in which information is stored on the basis of a change in electrical resistance value caused by the direction of magnetization and the presence or absence of magnetization. This memory is called the "MRAM (Magnetic Random Access Memory)" and various researches thereon have been conducted in recent years.

Many of MRAMs that have been under development in recent years adopt a scheme where information is stored using the residual magnetization of a ferromagnetic substance made of a giant magneto-resistance material and the stored information is read by converting a change in electrical resistance value caused by a difference of magnetization directions into a voltage. Also, information is written into a ferromagnetic memory cell and the information is rewritten by changing the magnetization direction in the ferromagnetic memory cell using a magnetic field induced by current flowing through a write line.

The cell structure of an MRAM and the driving method therefor is described by R. E. Scheuerlein, "1998 Proc. of Int NonVolatile Memory Conf. P47". This document proposes a structure in which a pair of write lines is arranged perpendicular to a pair of read lines. This document also proposes a structure (of a matrix type) in which a memory cell is connected to a diode in series and includes a giant magneto-resistance thin film that forms a pair of wires arranged perpendicular to each other and functions as both of a write line and a read line.

Also, U.S. Pat. No. 5,448,515 discloses a memory cell of a 1T1R type (meaning that each unit cell includes one transistor and one magneto-resistance element) in which a pair of lines arranged perpendicular to each other functions as both of a write line and a read line and a field effect type transistor used for cell selection is combined with a resistant element including a giant magneto-resistance thin film. This memory cell including the giant magneto-resistance thin film exhibits a magneto-resistance effect where different electrical resistance values are obtained by changing the direction of magnetization. This patent document also discloses a method of reading information stored in the 1T1R type memory cell.

Further, a document "2000 Proc. of Int Solid-State Circuits Conf. P128" proposes a memory cell having a 2T2R type structure where two field effect type transistors are combined with two TMR devices. With this structure, it is possible to increase signal strengths by complementarily setting the resistance values of the two TMR devices.

In the case of the matrix type structure proposed by R. E. Scheuerlein in "1998 Proc. of Int NonVolatile Memory Conf. P47", the strength of each signal is low and therefore it is difficult to detect information with stability.

In the case of the memory cell of the 1T1R type disclosed in U.S. Pat. No. 5,448,515, even if a tunnel magnetoresistance (TMR) element exhibiting a relatively high magneto-resistance change rate is used, the change rate of a resistance value caused by the application of a voltage of around 0.3 V is in a range of from 20% to 30% at best. If the applied voltage is further increased, there occurs a steep decrease in the magneto-resistance change rate, so that it becomes difficult to read information properly. Also, an extremely high MR ratio is required to curb the influences of fluctuations of resistance of the TMR element, the fluctuations of on-resistance of the transistor, and the like.

Further, in the case of the 2T2R type structure proposed in "2000 Proc. of Int Solid-State Circuits Conf. P128", a cell area becomes around twice as large as that in the case of the 1T1R type.

As described above, it is difficult to produce a 1T1R type MRAM, whose cell area is small and which operates with stability, using a variable resistor whose magneto-resistance value is changed by selecting the magnetization direction of a magnetic substance.

SUMMARY OF THE INVENTION

The present invention has been made in light of the above-mentioned problems with the conventional techniques, and therefore has an object to provide a memory structure enabling both of the reduction of the cell area of an MRAM and the stable detection of information stored in the MRAM, and to provide a driving method therefor.

The above-mentioned object is achieved by an information reproducing method for a magnetic memory including a variable resistor having a hard layer that is made of a magnetic substance and stores information on the basis of a direction of magnetization, a non-magnetic layer, and a soft layer that is made of a magnetic substance and has a coercive force that is smaller than that of the hard layer, the information reproducing method comprising the steps of: initializing the soft layer; detecting and holding a resistance value of the variable resistor; detecting another resistance value by reversing magnetization of the soft layer; and reproducing information by comparing the held resistance value with the resistance value detected afterward.

With this information reproducing method, the magnetization direction of the soft layer is reversed in order to change the resistance value of the variable resistor and information stored in the hard layer is read on the basis of a difference between the held resistance value obtained before the reversal and the resistance value obtained after the reversal. This makes it possible to read the stored information with precision in a state where the information remains in the hard layer. As a result, it becomes unnecessary to rewrite the information into the hard layer after the reading operation.

Also, it is more preferable that an insulator is used as the non-magnetic layer because it becomes possible to increase a magneto-resistance change rate.

Further, it is more preferable that each magnetic layer has magnetization in a vertical direction with reference to a film plane because it becomes possible to miniaturize a memory cell.

The above-mentioned object is also achieved by a magnetic memory comprising: a variable resistor including a hard magnetic layer for storing information on the basis of a direction of magnetization, a non-magnetic layer, and a soft magnetic layer having a coercive force that is smaller than a coercive force of the hard layer; a magnetic field generating means for initializing magnetization of the soft layer and reversing the initialized magnetization of the soft layer; a storage circuit of holding a resistance value obtained in a initialized state; and a signal detecting circuit for outputting a reproduction signal by comparing the held resistance value with a resistance value of the variable resistor obtained after the reversal.

With this structure, the storage circuit holds the resistance value of the variable resistor in a state where the soft layer is initialized by the magnetic field generating means, the resistance value of the variable resistor is changed by reversing the magnetization direction of the soft layer using the magnetic field generating means, and the signal detecting circuit reads information stored in the hard layer on the basis of the resistance values before and after the reversal. This makes it possible to read the stored information with precision in a state where the information remains in the hard layer. As a result, it becomes unnecessary to rewrite the information into the hard layer after the reading operation.

Here, the magnetic memory may further comprise: a plurality of bit lines that are parallel to each other; a plurality of word lines that are parallel to each other and are perpendicular to the bit lines; and a switching element connected to a word line formed on a semiconductor substrate so as to pass near a control terminal, one of terminals of the switching element being grounded, wherein the variable resistor and the switching element are provided for each intersection of the bit lines and the word lines, and one of terminals of the variable resistor is connected to the other of the terminals of the switching element, and the other of the terminals of the variable resistor is connected to a nearby bit line.

Also, the storage circuit may be a capacitor that is provided between a ground potential and one of two input terminals of a sense amplifier into which the potential of the bit line in the initialized state is inputted.

This structure is more preferable because it becomes possible to stabilize inputs into the sense amplifier using the capacitor, and to read information with more precision.

Here, another capacitor may further be provided between the ground potential and the other of the input terminals of the sense amplifier.

This structure is more preferable because it becomes possible to stabilize inputs into the other of the input terminals of the sense amplifier using the capacitor and to read information with more precision.

According to one aspect of the present invention, the switching element is a field effect type transistor, with a gate terminal being used as the control terminal, a source terminal being used as the terminal of the switching element that is grounded, and a drain terminal being used as the terminal of the switching element that is connected to a terminal of the variable resistor.

In addition, it is preferable that an insulator is used as the non-magnetic layer because it becomes possible to increase a magneto-resistance change rate.

Furthermore, according to another aspect of the present invention, it is preferable that each magnetic layer has magnetization in a vertical direction with reference to a film plane because it becomes possible to miniaturize a memory cell.

The present invention will be described in more detail in accordance with the following embodiments.

BRIEF DESCRIPTION OF THE DRAWINGS

FIG. 38A is a schematic diagram showing a state of magnetization caused by having a current flow through a write line in a predetermined direction, FIG. 38B is a schematic diagram showing a state of magnetization caused by having a current flow through a bit line in a predetermined direction, and FIG. 38C is a schematic top view of a magnetic resistor in the state shown in FIG. 38B;

DETAILED DESCRIPTION OF THE PREFERRED EMBODIMENTS

Embodiment modes of the present invention will be described in detail below with reference to the drawings.

Figure 1:
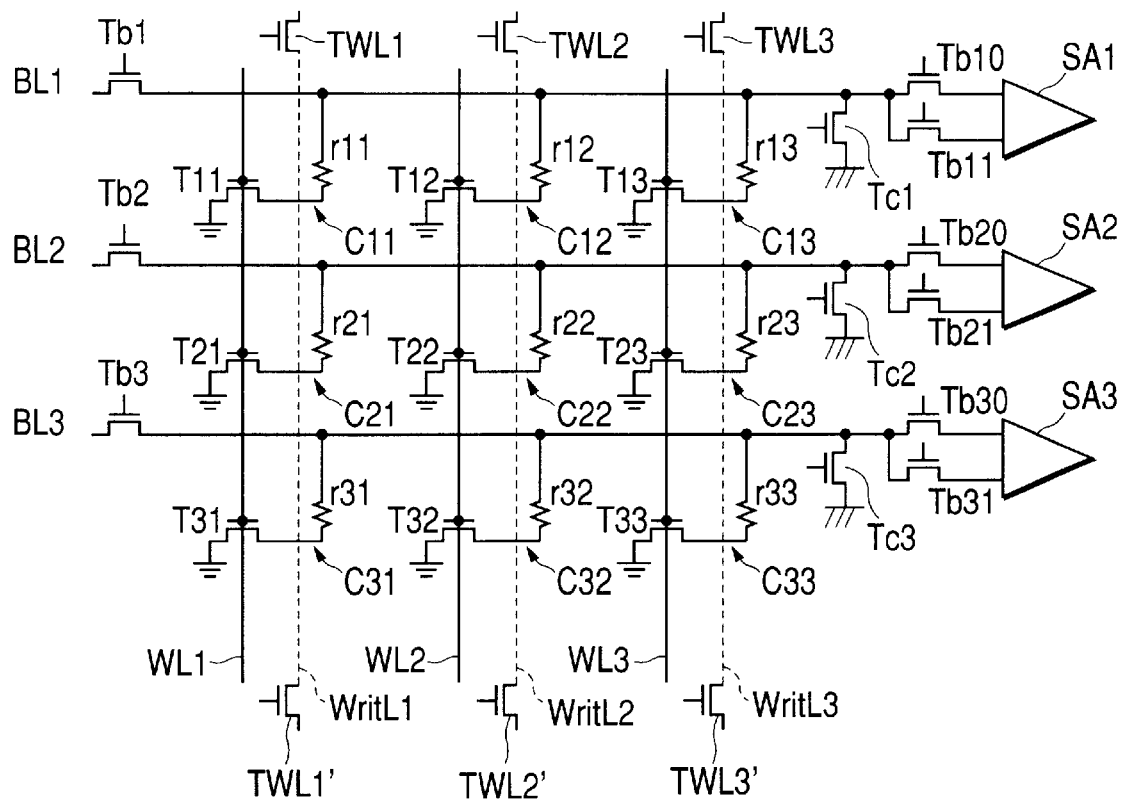
FIG. 1 is an equivalent circuit diagram showing the structure of a magnetic memory in accordance with an embodiment of the present invention.

FIG. 1 is an equivalent circuit diagram showing the structure of a magnetic memory according to one embodiment mode of the present invention.

The magnetic memory according to this embodiment mode includes memory cells C11 to C33 that are arranged to form a three by three matrix; word lines WL1, WL2, and WL3; bit lines BL1, BL2, and BL3; write lines WritL1, WritL2, and WritL3; field effect type transistors TWL1, TWL2, TWL3, TWL1', TWL2', TWL3', Tb1, Tb2, Tb3, Tb10, Tb20, Tb30, Tb11, Tb21, Tb31, Tc1, Tc2 and Tc3; and sense amplifiers SA1, SA2, and SA3.

The bit lines BL1, BL2, and BL3 are arranged parallel to each other and the word lines WL1, WL2, and WL3 are also arranged parallel to each other, with the bit lines BL1, BL2, and BL3 crossing the word lines WL1, WL2, and WL3. Like the word lines WL1, WL2, and WL3, the write lines WritL1, WritL2, and WritL3 are arranged parallel to each other and cross the bit lines BL1, BL2, and BL3. It is preferable that the write lines are arranged mainly to apply magnetic fields that determine the magnetization directions of TMR elements.

The memory cell C11 includes a field effect type transistor T11 and a TMR element r11 functioning as a variable resistor whose electrical resistance value is changed by selecting the magnetization direction of a magnetic film. In the memory cell C11, the drain of the field effect type transistor T11 is connected to one of terminals of the TMR element r11.

Similarly, each of the memory cells C12 to C33 has a similar structure where one of the field effect type transistors T12 to T33 is connected to corresponding one of the TMR elements r12 to r33.

The gate terminals of the field effect type transistors T11, T21, and T31 are all connected to the word line WL1 and the source terminals thereof are all grounded. Similarly, the gate terminals of the field effect type transistors T12, T22, and T32 are all connected to the word line WL2 and the gate terminals of the field effect type transistors T13, T23, and T33 are all connected to the word line WL3, with the source terminals thereof being all grounded.

Also, the others of the terminals of the TMR elements r11, r12, and r13 are all connected to the bit line BL1. Similarly, the others of the terminals of the TMR elements r21, r22, and r23 are all connected to the bit line BL2, and the others of the terminals of the TMR elements r31, r32, and r33 are all connected to the bit line BL3.

The field effect type transistors TWL1, TWL2, TWL3, TWL1,' TWL2,' and TWL3' are each a switching element. If field effect type transistors corresponding to each other (TWL1 and TWL1,' for instance) are turned on at the same time, current flows through a corresponding write line (WritL1, for instance).

The field effect type transistors Tb1, Tb2, and Tb3 are each a switching element that applies a voltage VDD to corresponding one of the bit lines BL1, BL2, and BL3 when turned on.

The field effect type transistors Tb10, Tb20, and Tb30 are each a switching element that inputs a voltage level of corresponding one of the bit lines BL1, BL2, and BL3 into one of the input terminals of corresponding one of the sense amplifiers SA1, SA2, and SA3 when turned on.

The field effect type transistors Tb11, Tb21, and Tb31 are each a switching element that inputs a voltage level of corresponding one of the bit lines BL1, BL2, and BL3 into the other of the input terminals of corresponding one of the sense amplifiers SA1, SA2, and SA3 when turned on.

The sense amplifiers SA1, SA2, and SA3 are each a signal detecting circuit that outputs one of "1" and "0" according to a result of comparison between two inputted voltage levels.

Figure 2:
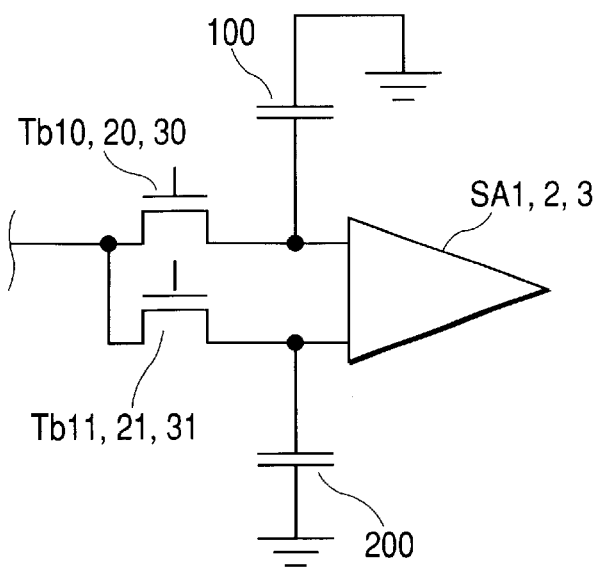
FIG. 2 is a circuit diagram showing a structure in which charging capacitors are provided for input terminals of a sense amplifier.

It should be noted here that it is preferable that, as shown in FIG. 2, capacitors 100 and 200 having capacitances larger than the parasitic capacitances of wires of the sense amplifiers SA1, SA2, and SA3 are provided to hold the levels of input voltages applied between the input terminals of the sense amplifiers and the field effect type transistors Tb10, Tb11, Tb20, Tb21, Tb30, and Tb31. Each capacitor functions in two ways described below. First, in order to allow the sense amplifiers SA1, SA2, and SA3 to compare the input voltage levels before and after the reversal of magnetization of layers (soft layers) having small coercive forces during a reading operation described below, the capacitors hold the input voltage levels before the magnetization reversal until the input voltage levels after the magnetization reversal are detected.

Secondly, by holding the input potentials of the sense amplifiers SA1, SA2, and SA3 using the capacitances larger than the parasitic capacitances of the wires, the capacitors reduce the effect of noise generated during the driving of the sense amplifiers, thereby enabling a noise-resistant reading operation. Also, the capacitor may be provided only for one of the input terminals of each of the sense amplifiers SA1, SA2, and SA3 into which the voltage level before the reversal of magnetization of the soft layer is inputted.

The writing of information into the magnetic memory is carried out by having current flow through both of desired bit lines and write lines. Also, the reading of information from the magnetic memory is carried out by selectively turning on the paired field effect type transistors (the transistors Tb10 and Tb11, for instance) connected to the same sense amplifier and by detecting fluctuations in voltage on the bit line during the reading operation using the sense amplifier.

These circuits are formed on a semiconductor substrate.

Figure 3B:
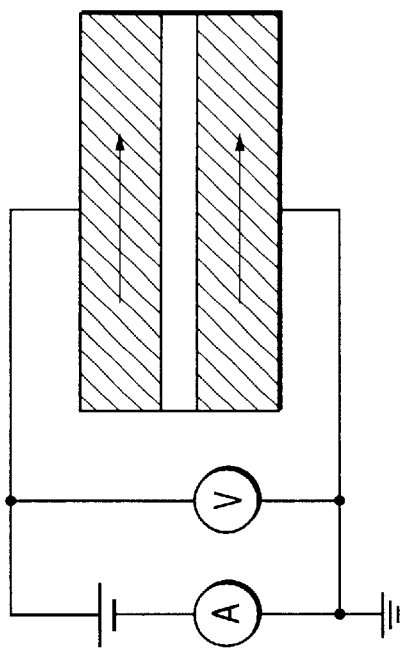
FIGS. 3A and 3B each illustrate an example of a magnetization state of a TMR element in the case of horizontal magnetization.
Figure 3D:
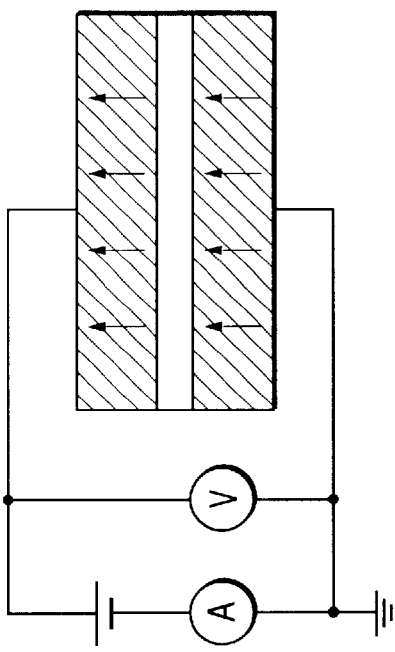
FIGS. 3C and 3D each illustrate an example of a magnetization state of a TMR element in the case of vertical magnetization.
Figure 3A:
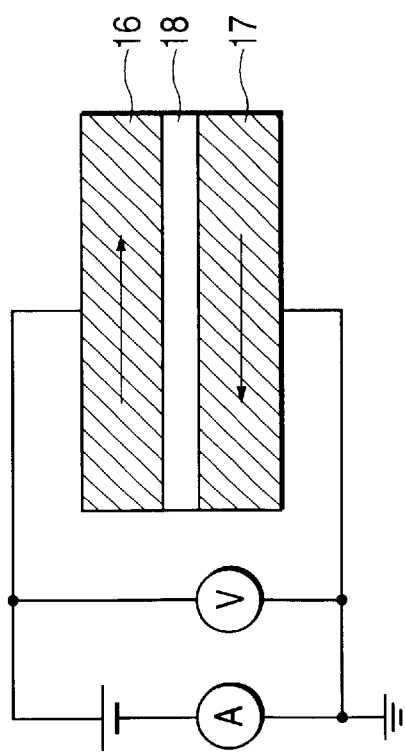

FIGS. 3A and 3B each illustrate a magnetization state of a TMR element in the case of horizontal magnetization. On the other hand, FIGS. 3C and 3D each illustrate a magnetization state of a TMR element in the case of vertical magnetization. The horizontal magnetization means the magnetization in a film in-plane direction, while the vertical magnetization means the magnetization in a film plane vertical direction. In either case, the magnetization of a magnetic film is reversed by a magnetic field induced by current flowing through wires. In this embodiment mode, it does not matter whether horizontal magnetization films or vertical magnetization films are used. However, for the purpose of miniaturizing a memory element, it is preferable to use a magneto-resistance effect element including vertical magnetization films. This is because if in-plane magnetization films are used, it becomes difficult to detect the magnetization direction of a magnetic film due to a phenomenon called "curling". This phenomenon becomes prominent if the size of the element is set at 1 $\mu$m×1 $\mu$m or less, for instance.

Referring to FIGS. 3A to 3D, in either case of the horizontal magnetization films and the vertical magnetization films, the TMR element has a construction where a non-magnetic layer 17 is sandwiched between a magnetic layer (a hard layer) 16 having a large coercive force and a magnetic layer (a soft layer) 18 having a coercive force that is smaller than that of the hard layer 16. The resistance value of a TMR element varies depending on whether the hard layer 16 and the soft layer 17 are magnetized in parallel and in the same direction (this magnetization state is hereinafter referred to as "parallel") or are magnetized in parallel and in an opposite direction (this magnetization state is hereinafter referred to as "opposite parallel"). In general, a great resistance value is obtained in the case of the "opposite parallel" of the magnetization direction of the soft layer and the hard layer and a small resistance value is obtained in the case of the "parallel" thereof.

The hard layer 16 is used as a layer for storing a memory. When stored information is rewritten, the magnetization direction of the hard layer 16 is changed. This means that a relatively strong external magnetic field is required to rewrite the stored information. A write current is applied and flows through both of a write lines (WritL) and a bit line (BL) and the magnetization direction of the hard layer 16 is determined by a synthesized magnetic field generated at the intersections of the write line and bit line. On the other hand, it is sufficient that the soft layer 17 has a small coercive force because this layer 17 is not required to hold information for a long period. Consequently, the soft layer 17 is made of a magnetic film whose magnetization direction is reversed by a relatively weak external magnetic field during a reading operation. The material and the like of the hard layer 16 are selected so that the magnetization direction of the hard layer 16 be not reversed even if the magnetization direction of the soft layer 17 is reversed during the reading operation.

For instance, in many cases, a TMR element is constructed using magnetic films made of metallic materials or alloys as the hard layer 16 and the soft layer 17 and using an oxide insulating material, such as $Al_2O_3$, as the non-magnetic layer 13.

Figure 4:
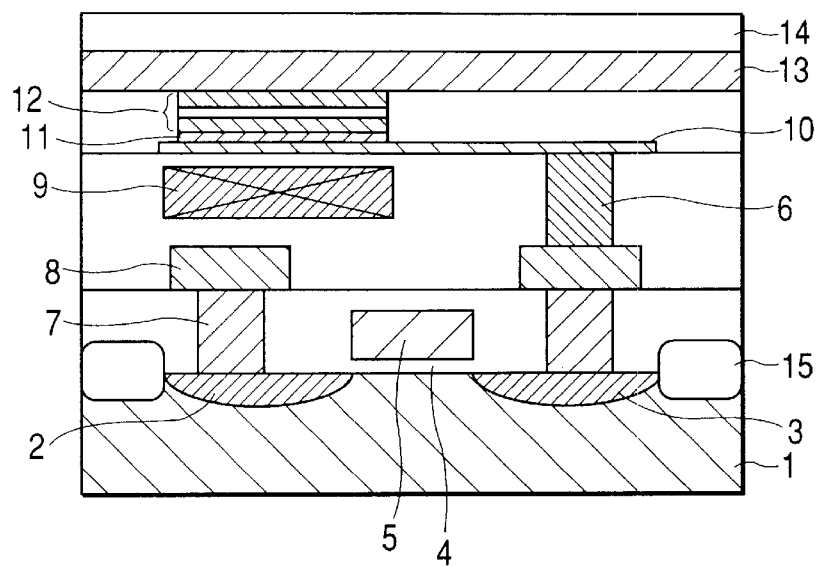
FIG. 4 is a cross sectional view showing an example of a memory structure in which a write line is arranged below a TMR element.

In the case of the horizontal magnetization films shown in FIGS. 3A and 3B, a write line 9 is arranged below the TMR element 12 as shown in FIG. 4 so that a magnetic field induced by the write current be applied to the TMR element 12 in the film in-plane direction.

Figure 3C:
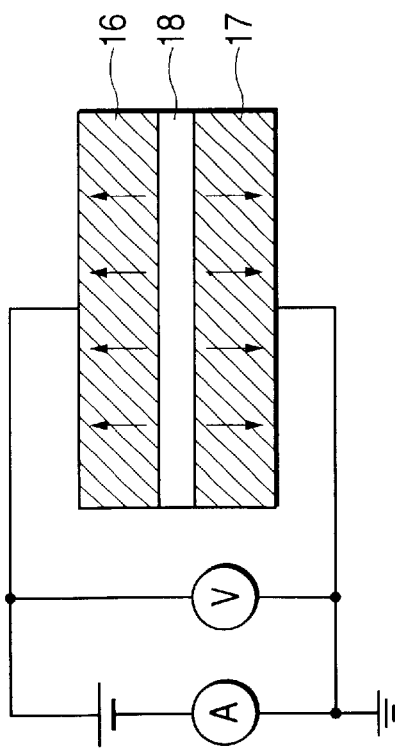

On the other hand, in the case of the vertical magnetization films shown in FIGS. 3C and 3D, it is preferable that a write line is arranged beside a TMR element because it is required to apply a write magnetic field to the TMR element in the film plane vertical direction.

The foregoing field effect type transistor is an example of a switching element that selectively turns on/off a circuit according to an electric signal. A thin film transistor (TFT) may be used in addition to the field effect type transistor. Also, a diode formed on a semiconductor substrate may be used as the switching element.

For instance, the semiconductor substrate is mainly composed of materials, such as silicon, germanium, gallium, indium, and diamond, which have semiconductor characteristics, with these materials being used singly or in combination or being subjected to crystallization or impurity mixing.

The operation of the magnetic memory according to this embodiment mode is described below.

First, by way of example, the operation for writing information into the TMR element r22 is described below.

Figure 5:
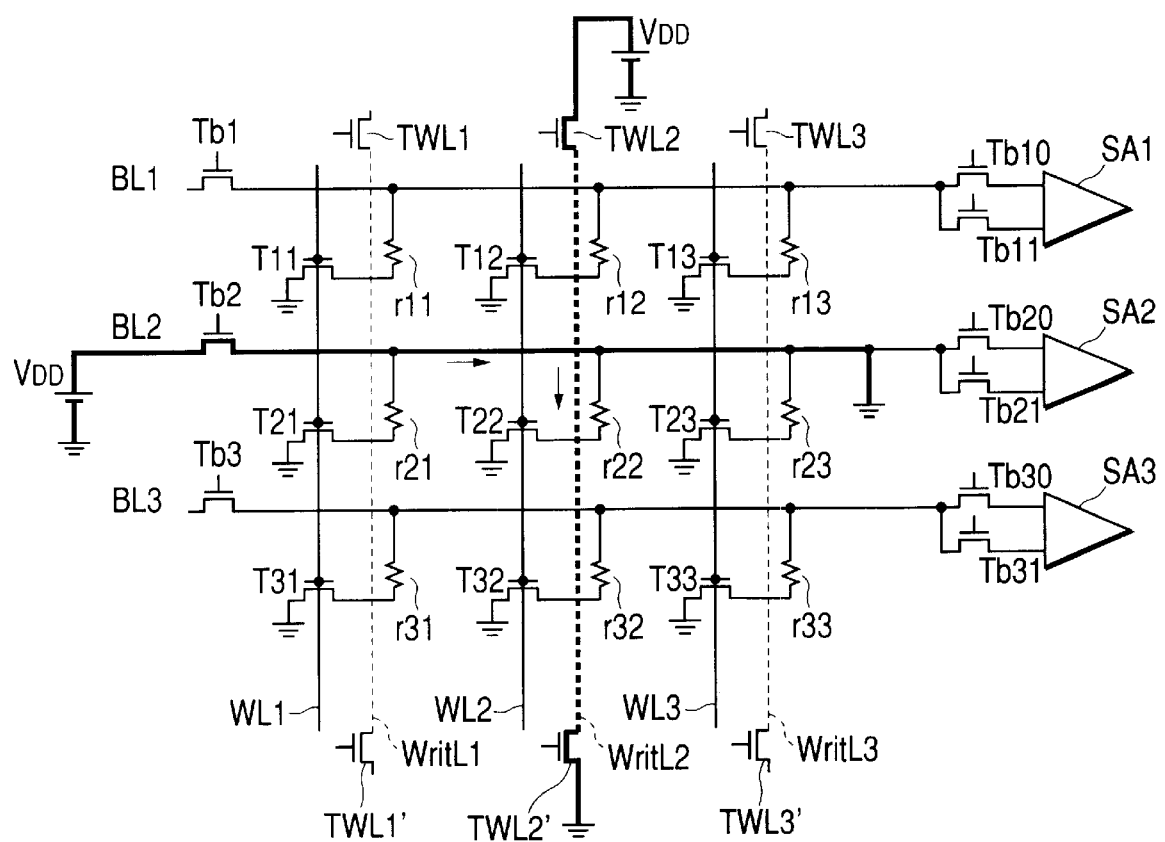
FIG. 5 illustrates a writing operation.

As shown in FIG. 5, currents are applied to the write line WritL2 and the bit line BL2 to induce a magnetic field that determines the magnetization direction of the hard layer of the TMR element r22. Information "1" or "0" is stored in the TMR element r22 according to the magnetization direction of the hard layer.

Next, the operation for reading information from the TMR element r22 is described.

Figure 6A:
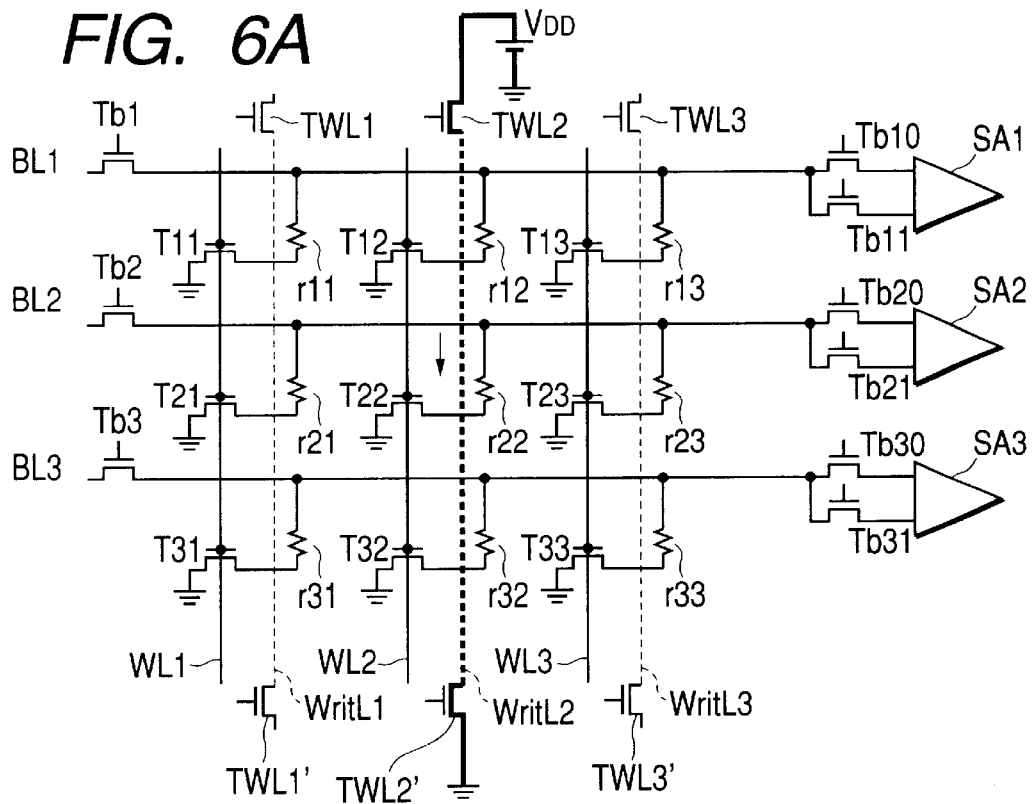
FIG. 6A illustrates an operation for magnetizing a soft layer in a predetermined direction by applying a current to a write line.

First, as shown in FIG. 6A, a current is applied to the write line WritL2 to magnetize the soft layer in a predetermined direction. Thus, the magnetization direction of the soft layer is initialized, although the magnetization direction of the hard layer does not change because the magnetic field generated in this case is smaller than that generated during the information writing. In this example, it is assumed that the magnetization state of the TMR element r22 after the initialization becomes "opposite parallel" and the TMR element r22 exhibits a high resistance. That is, the TMR element r22 after the initialization is in the magnetization state shown in FIG. 3A or 3C.

Figure 6B:
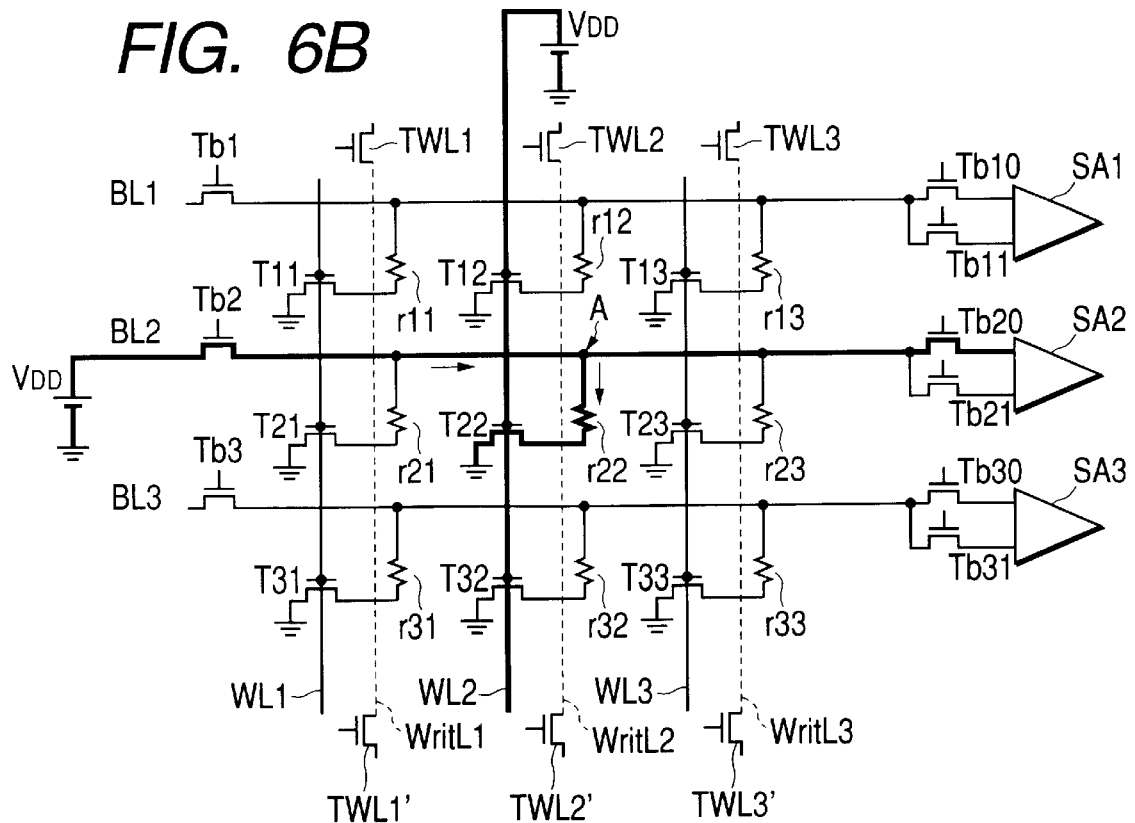
FIG. 6B illustrates an operation for applying a current to a TMR element by turning on a field effect type transistor of a word line and a field effect type transistor of a bit line.

Next, as shown in FIG. 6B, the voltage applied to the word line WL2 is raised to turn on the field effect type transistor T22. As a result, the field effect type transistor Tb2 is turned on and a current flows through the TMR element r22 via the bit line BL2. During this operation, the field effect type transistor Tb20 is turned on, a voltage is inputted into one of the terminals of the sense amplifier SA2, and a potential is held by the foregoing capacitor or the like. As a result of this operation, the voltage at the point "A" on the bit line BL2 is inputted into one of the terminals of the sense amplifier SA2. During this operation, the word lines WL1 and WL3 are grounded to prevent the flow of current to the TMR elements r21 and r23 that are also connected to the bit line BL2.

Figure 6C:
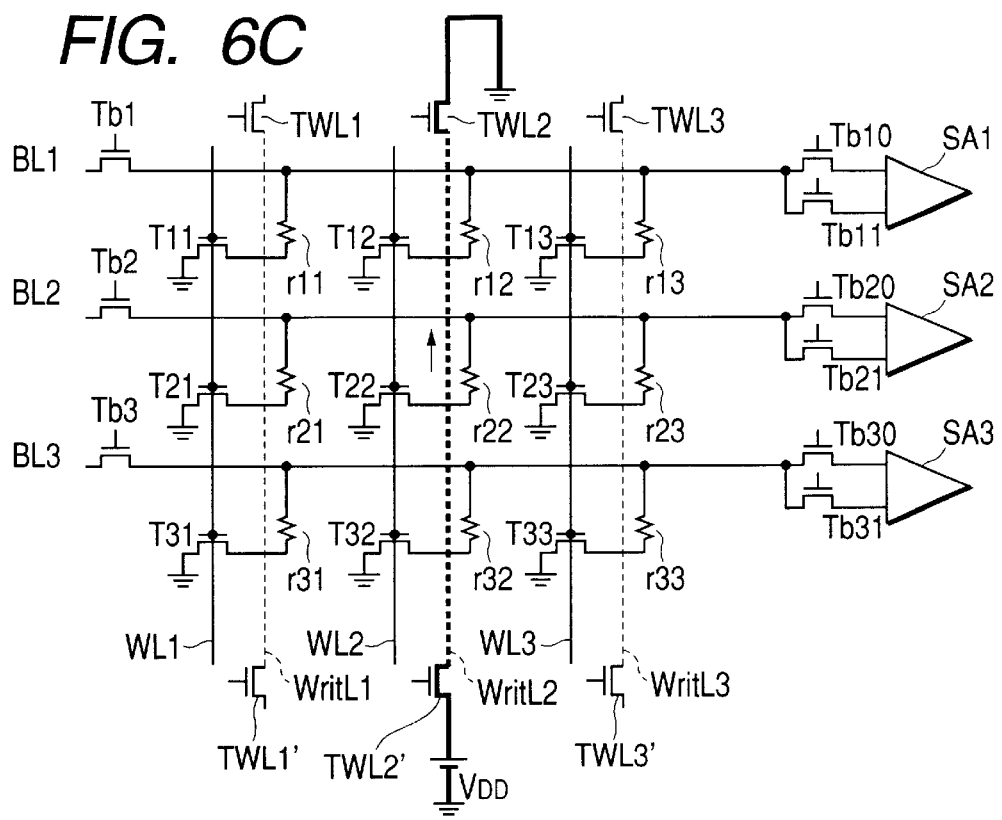
FIG. 6C illustrates an operation for reversing a magnetization direction of the soft layer.

Following this, as shown in FIG. 6C, a current is applied to the write line WritL2 in a direction opposite to the current flow direction during the initialization (FIG. 6A), thereby reversing the magnetization direction of the soft layer. As a result, the magnetization state of the TMR element r22 becomes "parallel" and exhibits a low resistance value.

Figure 6D:
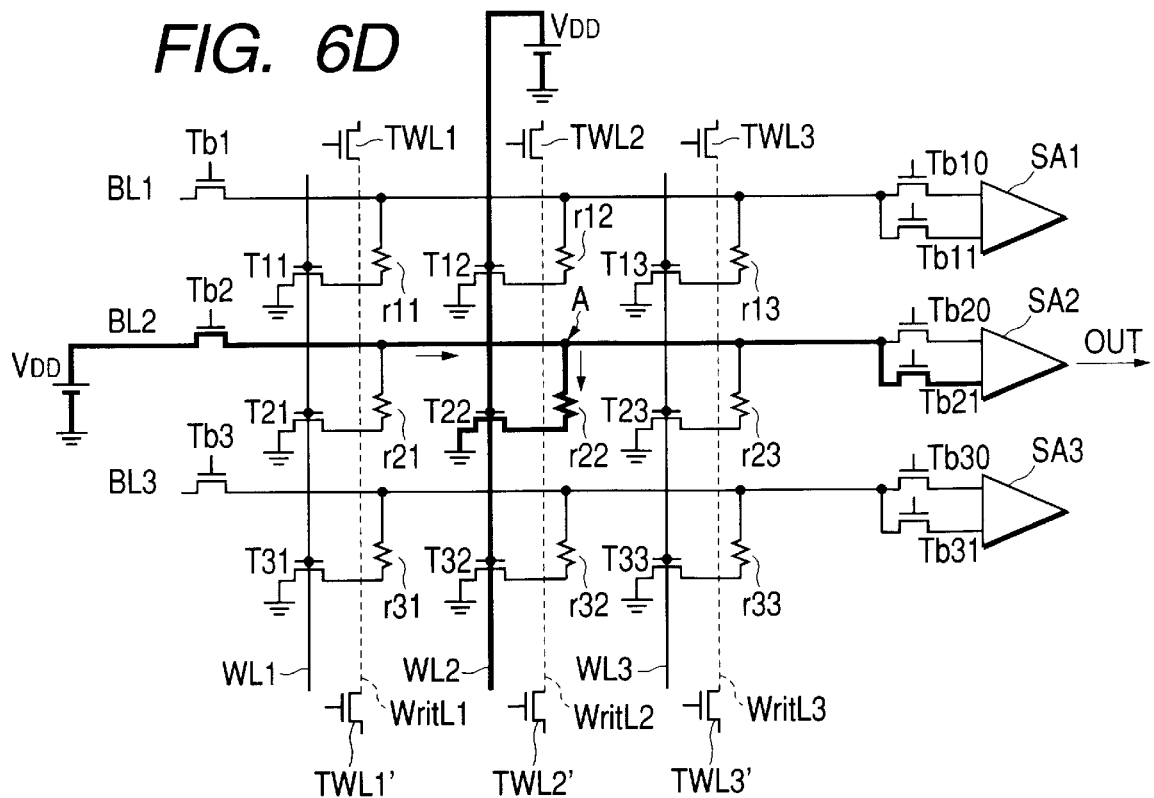
FIG. 6D illustrates an operation for applying a current to a TMR element by turning on a field effect type transistor of a word line and a field effect type transistor of a bit line.

Next, as shown in FIG. 6D, the voltage applied to the word line WL2 is raised, thereby turning on the field effect type transistor T22. As a result, the field effect type transistor Tb2 is turned on and a current flows through the TMR element r22 via the bit line BL2. During this operation, unlike in the case shown in FIG. 6B, the field effect type transistor Tb21 is turned on, a voltage is inputted into the other of the terminals of the sense amplifier SA2, and a potential is held by the capacitor. As a result of this operation, the voltage at the point "A" on the bit line BL2 is inputted to the other of the input terminals of the sense amplifier SA2.

Consequently, in the sense amplifier SA2, the voltage inputted into the input terminal on the Tb20 side becomes higher than the voltage inputted into the input terminal on the Tb21 side. These voltages are compared with each other and "1", for instance, is outputted as a result of the comparison.

Figure 7:
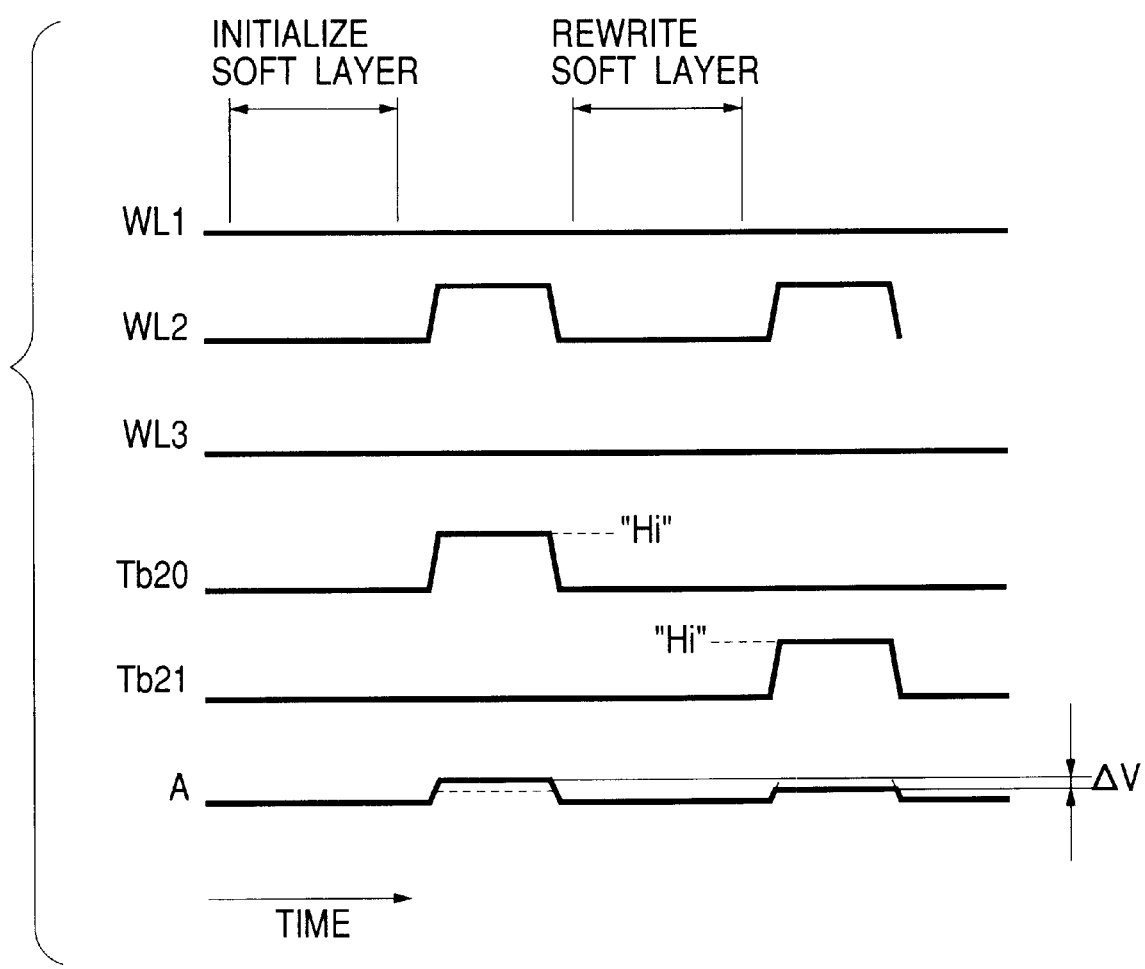
FIG. 7 is a timing chart showing a reading operation.

FIG. 7 is a timing chart showing an information reading operation. This drawing shows changes in the potentials of the word lines WL1 to WL3, potentials of the gate electrodes of the field effect type transistors Tb20 and Tb21, and changes in the potential at the point "A". The field effect type transistors Tb20 and Tb21 are turned on when the potentials of their gate electrodes are at "Hi" levels. Also, the difference voltage ΔV at the point "A" before and after the magnetization reversal is a signal detected by the sense amplifier SA2. In this example, the sense amplifier SA2 outputs "1" as a result of the detection of the voltage difference ΔV. However, if the direction of magnetization stored in the hard layer is opposite to the direction described above, the signal at the point "A" becomes as represented by the dotted line, so that the sense amplifier SA2 outputs "0".

That is, the reading operation includes a characteristic operation where magneto-resistance values before and after the reversal of the magnetization direction of the soft layer are obtained by holding the potential at the point "A" before the magnetization reversal and comparing the held potential with a potential at the point "A" after the magnetization reversal. To do so, it is preferable that the magnetization direction of the soft layer is determined in advance. Prior to a reading operation, the soft layer is initialized so that the soft layer is magnetized in a predetermined direction.

FIG. 2 shows a specific arrangement of the capacitors described above. The capacitors are arranged between the input terminals of the sense amplifiers SA1, SA2, and SA3 and the ground potential and are charged with the potentials at the point "A" before and after the reversal of the magnetization direction of the soft layer 17.

By performing a reading operation in this manner, the magnetization direction of the soft layer is reversed, the resistance value of the variable resistor is changed, and information stored in the hard layer is read on the basis of the difference between the held potential (resistance value) at the point "A" before the magnetization reversal and the potential (resistance value) at the point "A" after the magnetization reversal. This makes it possible to read stored information with precision in a state where the stored information is held in the hard layer. As a result, it becomes unnecessary to rewrite the read information into the hard layer after the reading operation. Also, the technique of the present invention enables a noise-resistant reading operation. As a result, it becomes possible to read the stored information with precision using a simple structure and a simple reading operation. This is one of the noticeable features of the present invention.

Embodiments of the magnetic memory according to the present invention will be described below.

<First Embodiment>

In this embodiment, a TMR element having a structure where a tunnel insulating film is sandwiched between two magnetic thin films is used as a variable resistor.

The magnetic thin films each are the magnetic films with horizontal magnetization shown in FIGS. 3A and 3B. The TMR element exhibits different resistances according to whether the magnetization directions of the hard layer and the soft layer are in the "parallel" state or in the "opposite parallel" state. Also, these magnetization directions do not change until a magnetic field is applied from the outside, thereby realizing a nonvolatile memory.

First is described the production process of the memory of this embodiment.

Figure 8:
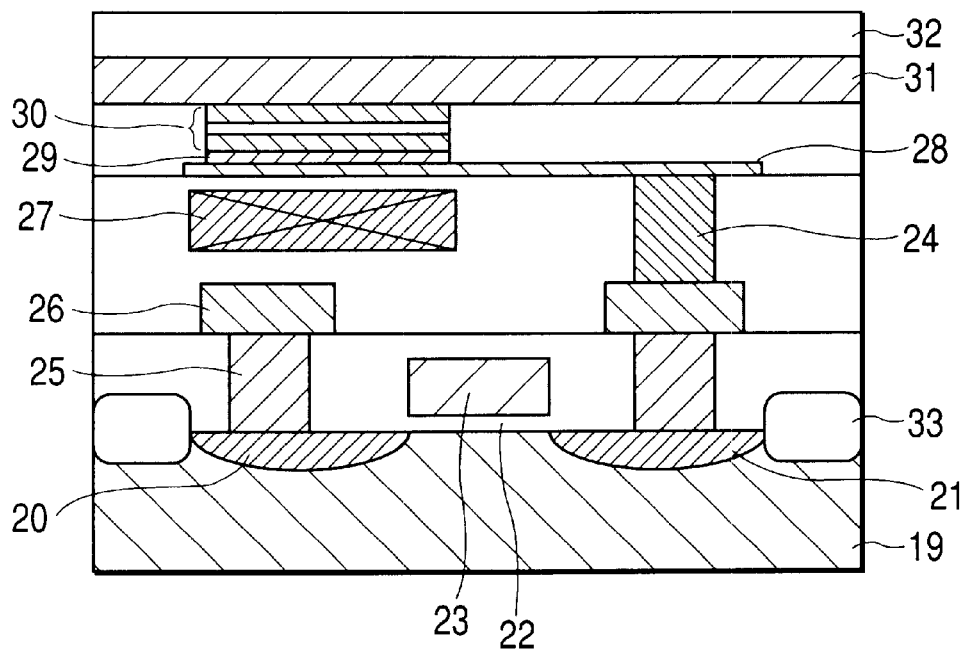
FIG. 8 is a cross sectional view showing the structure of a magnetic memory that uses films with horizontal magnetization.

As shown in FIG. 8, a buried type element separating region 33 made of $SiO_2$, an n-type diffusing regions 21 and 20 that are the drain and source of a field effect type transistor functioning as a switching element, an $SiO_2$ gate insulating film 22, and a polysilicon gate electrode 23 are formed on a p-type silicon substrate 19.

Also, a TMR element 30 having a lamination structure of $Co/Al_2O_3/NiFe$ is used and is connected to the drain of the field effect type transistor via a TiN local wire 28 and to a bit line 31 made of Ti/AlSiCu/Ti.

It should be noted here that a write line 27 is arranged below a TMR layer 30 in order to perform horizontal magnetize in the TMR layer 30.

A memory having this structure was designed under a 0.5 $\mu m$ rule (meaning that the minimum permissible size is 0.5 $\mu m$) and a test sample was produced by arranging memory cells to form a three by three matrix.

Also, the sense amplifiers SA1, SA2, and SA3 were produced as peripheral circuits. A capacitor with a capacitance of around 5 pF was connected between each input terminal of each of the sense amplifiers SA1, SA2, and SA3 and the ground potential.

Pulse signals of 0 V and 3.3 V were inputted from the outside to have the memory perform a differential operation. During this differential operation, a potential difference (corresponding to $\Delta V$ in FIG. 7) of around +/−20 mV was observed on the bit line, which means that a reading operation was performed normally. Also, a writing operation was performed by having a write current flow through the bit lines and the write lines and it was confirmed that the code represented by $\Delta V$ changed and the writing operation was performed normally.

<Second Embodiment>

Figure 9:
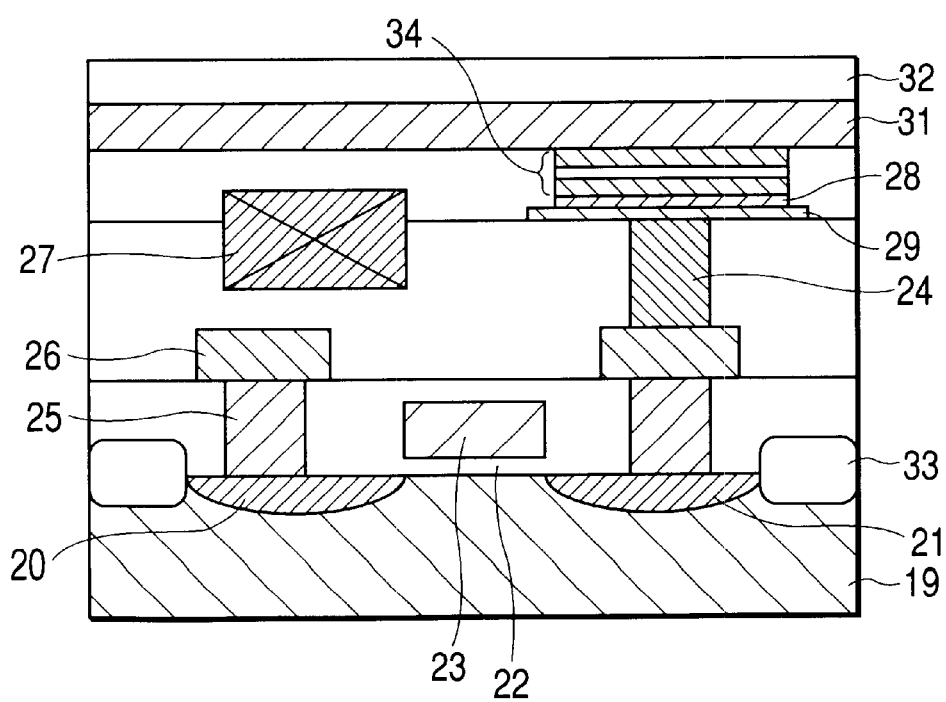
FIG. 9 is a cross sectional view showing the structure of a magnetic memory that uses films with vertical magnetization.

A trial memory cell shown in FIG. 9 was produced according to the same production process as described in the first embodiment. However, in this embodiment, a TMR layer 34 including a lamination film of $GdFe/Co/Al_2O_3/Co/GdFe$ was formed, and the write line 27 was arranged beside the TMR element 34 in order to apply a magnetic field to the TMR element 34 in the film plane vertical direction. In this embodiment, the soft layer and the hard layer are each a vertical magnetization film. It is preferable that a ferrimagnetic film is used as the vertical magnetization film. It is also preferable that a Co layer is inserted because the spin polarizability of Co is larger than that of GdFe and therefore it becomes possible to obtain a high magneto-resistance change rate. It is also preferable that a switched junction is established between Co and GdFe and magnetization occurs in the film plane vertical direction. With this construction, unlike in the case of the horizontal magnetization films, the curling of magnetization does not occur as described above, so that it becomes possible to miniaturize the memory cell. In addition, it becomes unnecessary to provide a local wire and to provide a TMR element immediately above the drain region of the switching element. As a result, it becomes possible to produce the memory cell of this embodiment with a simple production process and to miniaturize the memory. In this respect, the structure described above is preferable.

This memory cell was operated using the recording and reproducing method described above and it was confirmed that the reading operation and the writing operation were both performed normally.

<Third Embodiment>

In this embodiment, diodes formed on a semiconductor substrate are used as switching elements.

Figure 10:
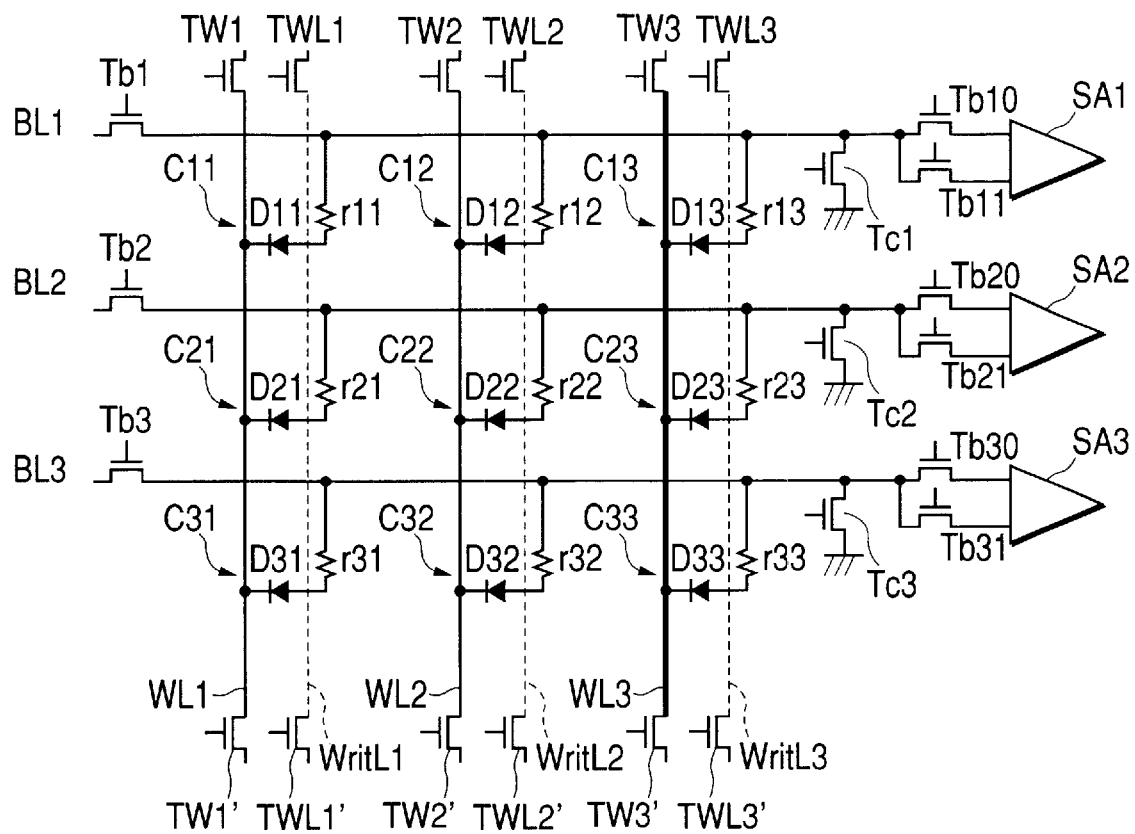
FIG. 10 is an equivalent circuit diagram of a magnetic memory in accordance with a third embodiment of the present invention.

FIG. 10 is an equivalent circuit diagram according to this embodiment. Note that the same construction elements as in FIG. 1 are given the same reference numerals and are not described in this embodiment.

A memory cell C11 of this embodiment includes a switching element D11 (a PN junction type diode is used here and is hereinafter simply referred to as "diode") and a TMR element r11 functioning as a variable resistor. One of the terminals of the diode D11 is connected to one of the terminals of the TMR element r11.

Similarly, each of the memory cells C12 to C33 has a structure where one of diodes D12 to D33 is connected to corresponding one of TMR elements r12 to r33.

The others of the terminals of the diodes D11, D21, and D31 are all connected to the word line WL1. Similarly, the others of the terminals of the diodes D12, D22, and D32 are all connected to the word line WL2, and the others of the terminals of the diodes D13, D23, and D33 are all connected to the word line WL3.

The structure according to this embodiment is characterized in the following two points.

(1) Diode used as switching elements for selecting respective TMR elements are formed on the surface of a semiconductor substrate.

(2) Word line, TMR elements, and bit lines are laminated immediately above the diodes formed on the semiconductor substrate.

This construction allows wires including word lines and bit lines to be formed after the switching elements are formed on the substrate. Therefore, it becomes possible to perform heat treatment at a sufficiently high temperature without concern for melting and degradation of the wires during the process for forming the switching elements. This makes it possible to form diodes having superior characteristics and to realize an MRAM that operates with stability.

Figure 11:
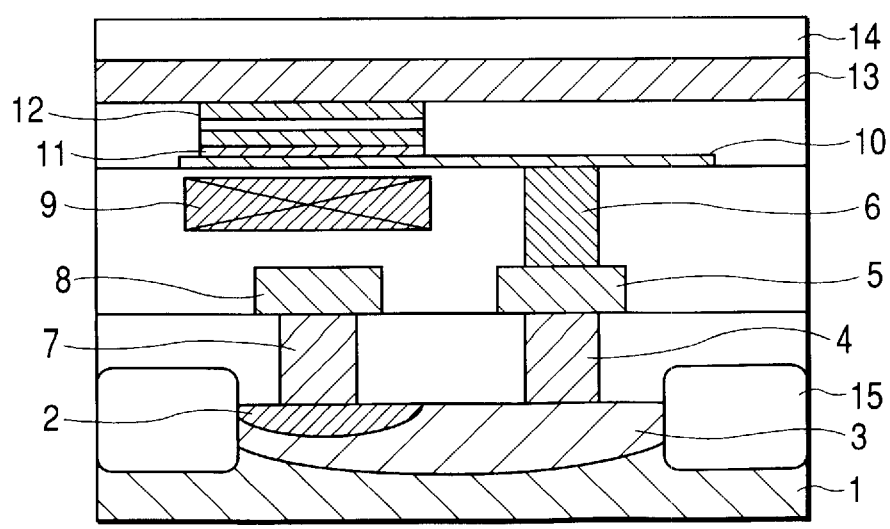
FIG. 11 is a cross sectional view showing the structure of the magnetic memory in accordance with the third embodiment of the present invention.
Figure 12:
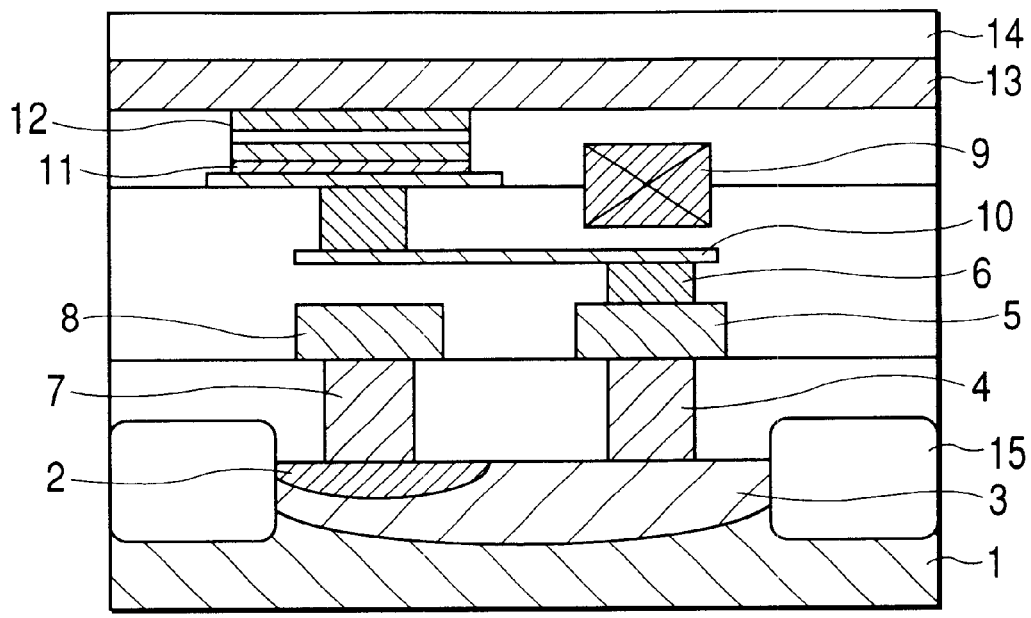
FIG. 12 is a cross sectional view showing a structure in the case where a magneto-resistance element with vertical magnetization is used in the third embodiment of the present invention.

Also, as shown in FIG. 11, a ground line 8 (word line), a write line 9, a TMR element 12, and a bit line 13 are laminated immediately above the diode. This reduces the total area of the substrate occupied by the TMR element, the diode, the bit line 13, the ground line 8, and the write line 9. As a result, the area of the element is reduced. In the case where vertical magnetization films are used as the magnetization layers of the TMR element, it is required that the magnetic field induced by a write current flowing through the write line is applied vertically with reference to the TMR element 12. Therefore, in this case, the write line 9 is not arranged immediately below the TMR element but arranged beside the TMR element as shown in FIG. 12.

FIG. 11 is a cross sectional view showing an example of a memory cell structure according to this embodiment.

In the memory cell of this embodiment, a PN junction diode including a p-type diffusing region 3 and n-type diffusing region 2 is formed on a n-type semiconductor substrate, the p-type diffusing region 3 on the n-type semiconductor substrate whose region is separated by an element separating region 15 is connected to one of the terminals of the TMR element 12, which functions as a variable resistor whose electrical resistance value is changed by selecting the magnetization direction of a ferromagnetic substance, via a local wire 10, contact plugs 4 and 6, and a metallic wiring layer 5.

The other of the terminals of the TMR element 12 is connected to a bit line 13 and an n-type diffusing region 2 of the PN junction diode is connected to a ground line 8 (word line) via a contact plug 7.

A write line 9 is arranged perpendicular to the bit line 13. During a writing operation, currents are applied to both of the write line 9 and the bit line 13, thereby inducing a magnetic field that changes the magnetization direction of a magnetic film.

Figure 13:
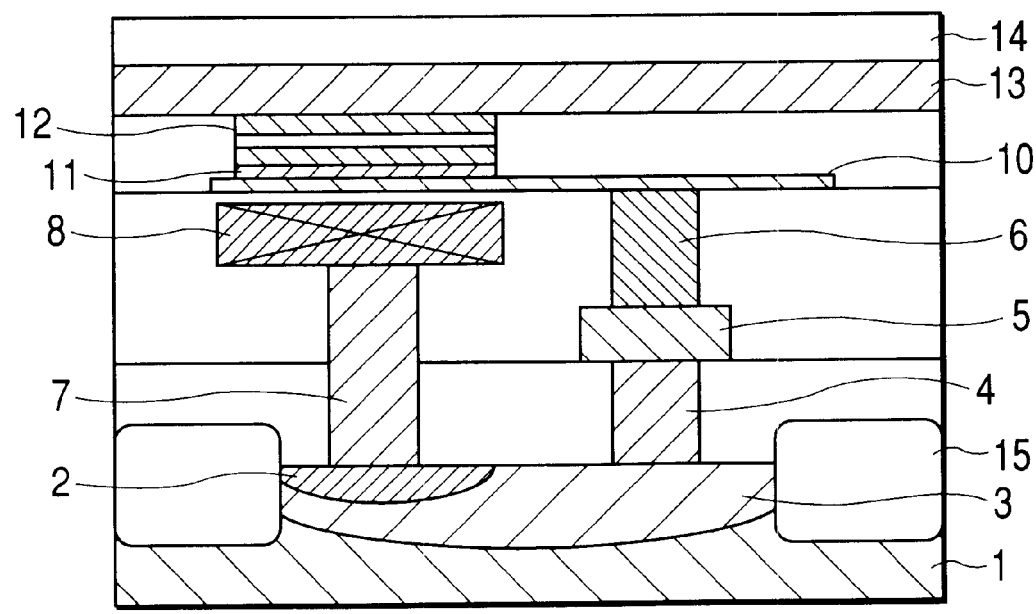
FIG. 13 shows a structure where a ground line doubles as a write line in the third embodiment of the present invention.

It should be noted here that the write line 9 may be eliminated as shown in FIG. 13. In this case, the ground line 8 doubles as the write line 9.

The PN junction diode has a structure where a semiconductor (the p-type diffusing region 3) doped with p-type impurities is connected to a semiconductor (the n-type diffusing region 2) doped with n-type impurities. This PN-junction diode is produced, for instance, by diffusing impurities in a semiconductor substrate 1 made of silicon or by laminating semiconductor thin films.

Next, how the nonvolatile solid-state magnetic memory of this embodiment operates is described. By way of example, the following description concerns a case where a three-bit by three-bit memory uses TMR elements with horizontal magnetization.

First, the operation for writing information into the TMR element r22 is described.

Figure 14:
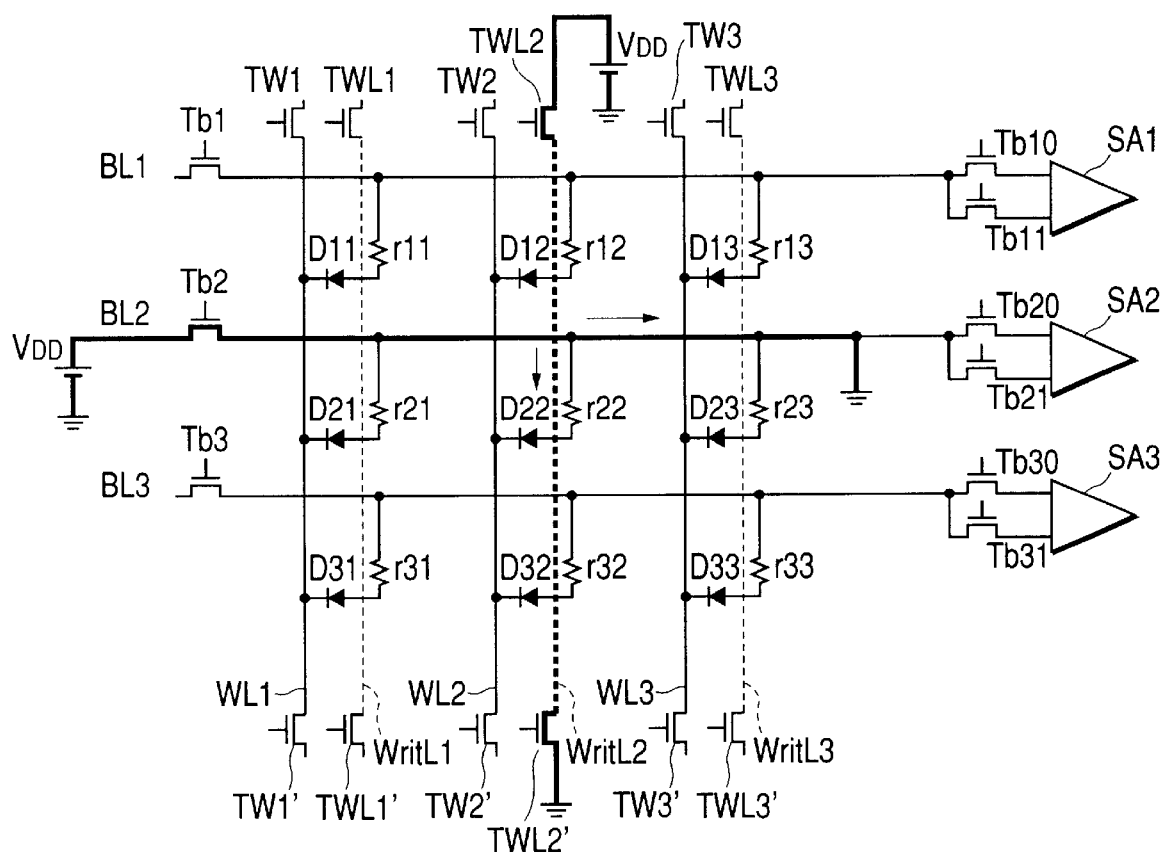
FIG. 14 is an equivalent circuit diagram showing an operation performed during a writing operation in the third embodiment of the present invention.

As shown in FIG. 14, currents are applied to the write line WritL2 and the bit line BL2 to induce a magnetic field that determines the magnetization direction of the hard layer of the TMR element r22. Information "1" or "0" is stored in the TMR element r22 by the magnetization direction of the hard layer.

Next, the operation for reading information written in the TMR element r22 is described.

Figure 15A:
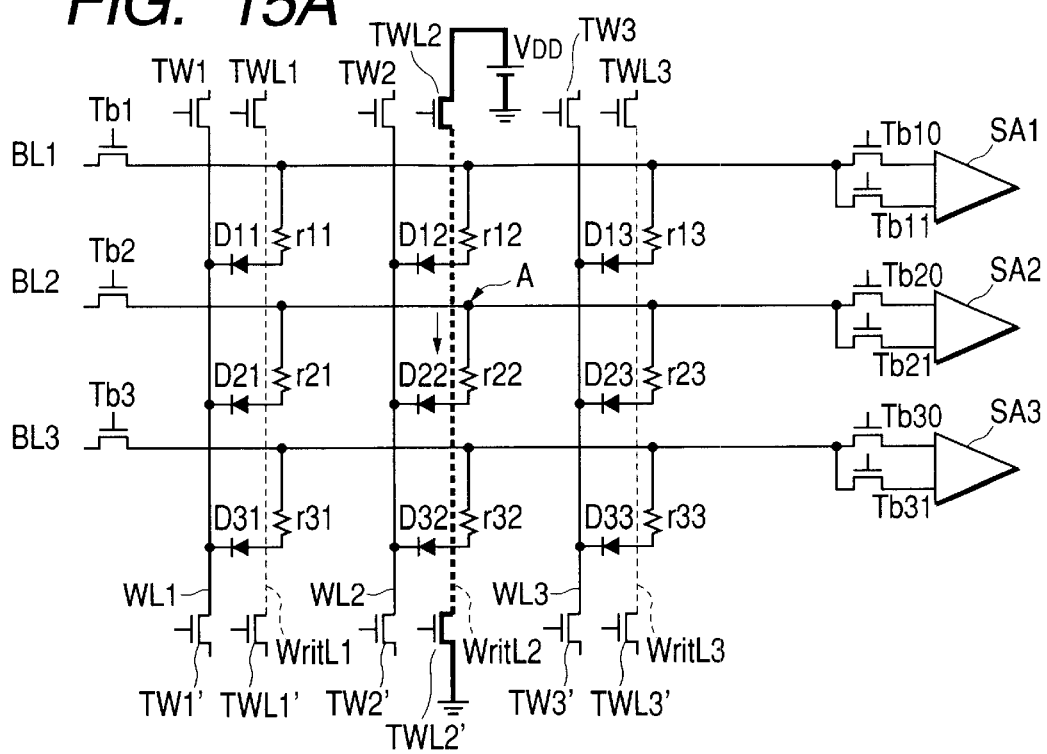
FIG. 15A illustrates an operation for magnetizing a soft layer in a predetermined direction by having a current flow through a write line in the third embodiment of the present invention.

First, as shown in FIG. 15A, a current is applied to the write line WritL2, thereby magnetizing the soft layer in a predetermined direction. Thus, the magnetization direction of the soft layer is initialized, although the magnetization direction of the hard layer does not change because the magnetic field generated in this case is smaller than that generated during the writing operation. In this embodiment, it is assumed that the TMR element r22 is placed in the "opposite parallel" state and exhibits a high resistance value after the initialization.

Figure 15B:
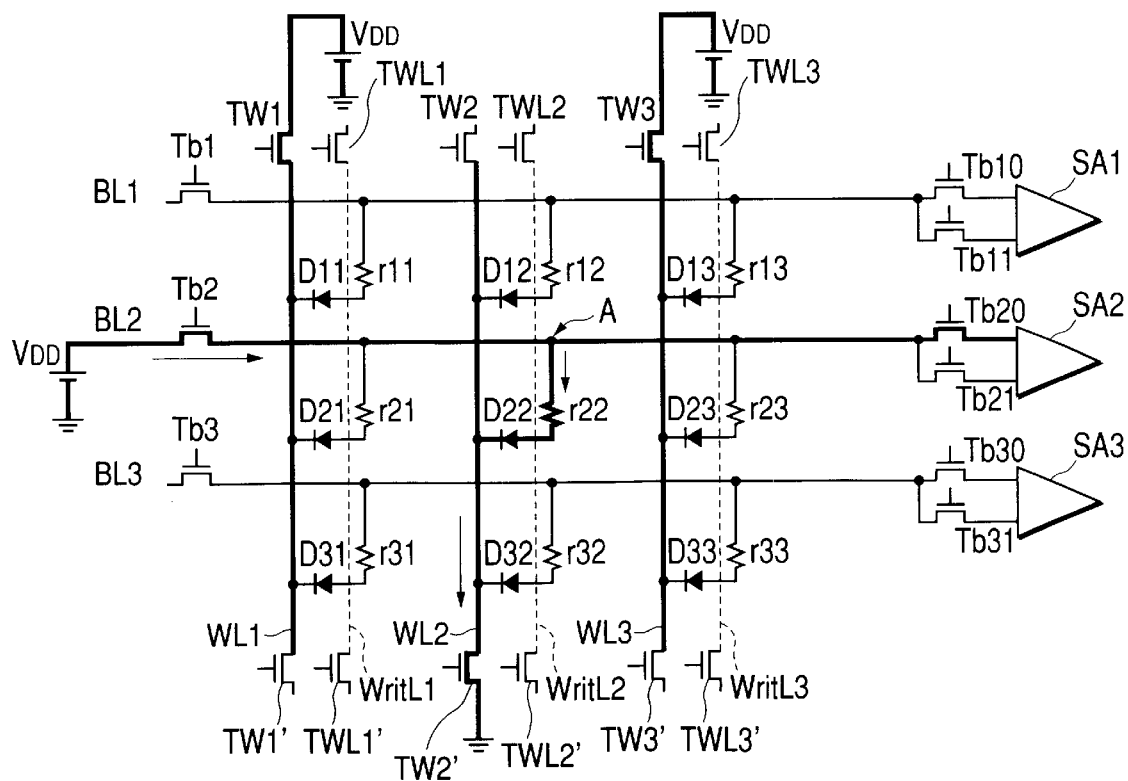
FIG. 15B illustrates an operation for having a current flow through a TMR element by turning on a field effect type transistor of a word line and a field effect type transistor of a bit line.

Next, as shown in FIG. 15B, the field effect type transistors Tb2 and TW2' are turned on and a current flows through the TMR element r22 via the bit line BL2. During this operation, the field effect type transistor Tb20 is turned on and a voltage is inputted into one of the input terminals of the sense amplifier SA2. As a result of this operation, the voltage at the point "A" on the bit line BL2 is inputted into one of the input terminals of the sense amplifier SA2. During this operation, a voltage VDD is applied to each of the word lines WL1 and WL3 to prevent the flow of current through the TMR elements r21 and r23 that are also connected to the bit line BL2. As a result, a reverse bias is applied to the diodes D11, D21, D31, D13, D23, and D33.

Figure 15C:
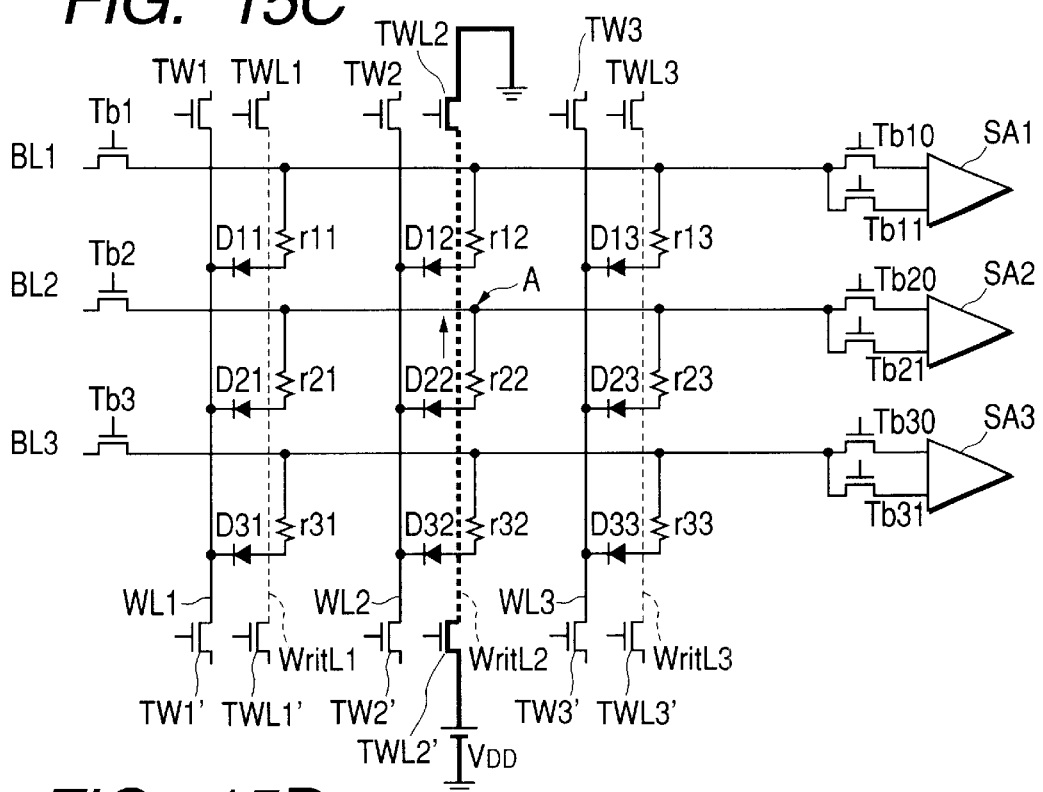
FIG. 15C illustrates an operation for reversing a magnetization direction of the soft layer.

Following this, as shown in FIG. 15C, a current is applied to the write line WritL2 in a direction opposite to the current flow direction during the initialization shown in FIG. 15A, thereby reversing the magnetization direction of the soft layer. As a result, the magnetization state of the TMR element r22 becomes "parallel" and the TMR element r22 exhibits a low resistance value.

Figure 15D:
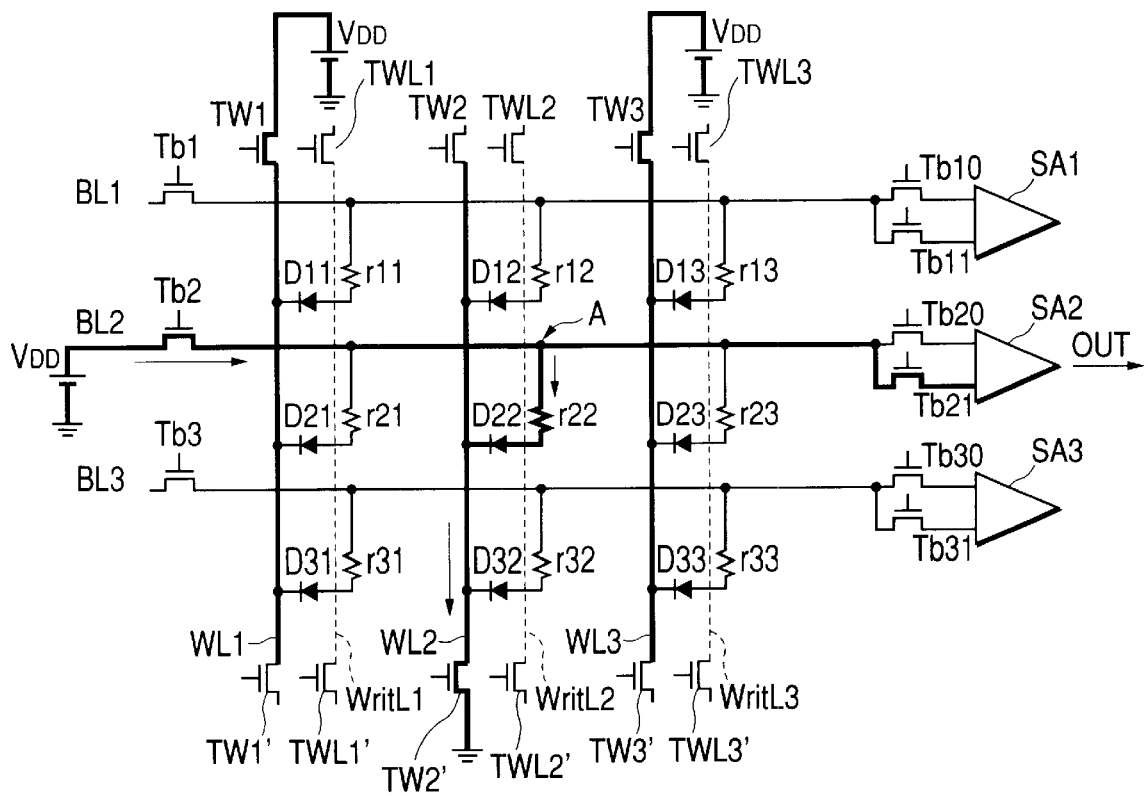
FIG. 15D illustrates an operation for having a current flow through a TMR element by turning on a field effect type transistor of a word line and a field effect type transistor of a bit line.

Next, as shown in FIG. 15D, the field effect type transistors Tb2 and TW2' are turned on and a current flows through the TMR element r22 via the bit line BL2. During this operation, unlike the case shown in FIG. 15B, the field effect type transistor Tb21 is turned on and a voltage is inputted into the other of the input terminals of the sense amplifier SA2. As a result of this operation, the voltage at the point "A" on the bit line BL2 is inputted to the other of the input terminals of the sense amplifier SA2.

Consequently, in the sense amplifier SA2, the voltage inputted into the input terminal on the Tb20 side becomes higher than the voltage inputted into the input terminal on the Tb21 side. As a result of comparison of these voltages, "1" is outputted, for instance.

Figure 16:
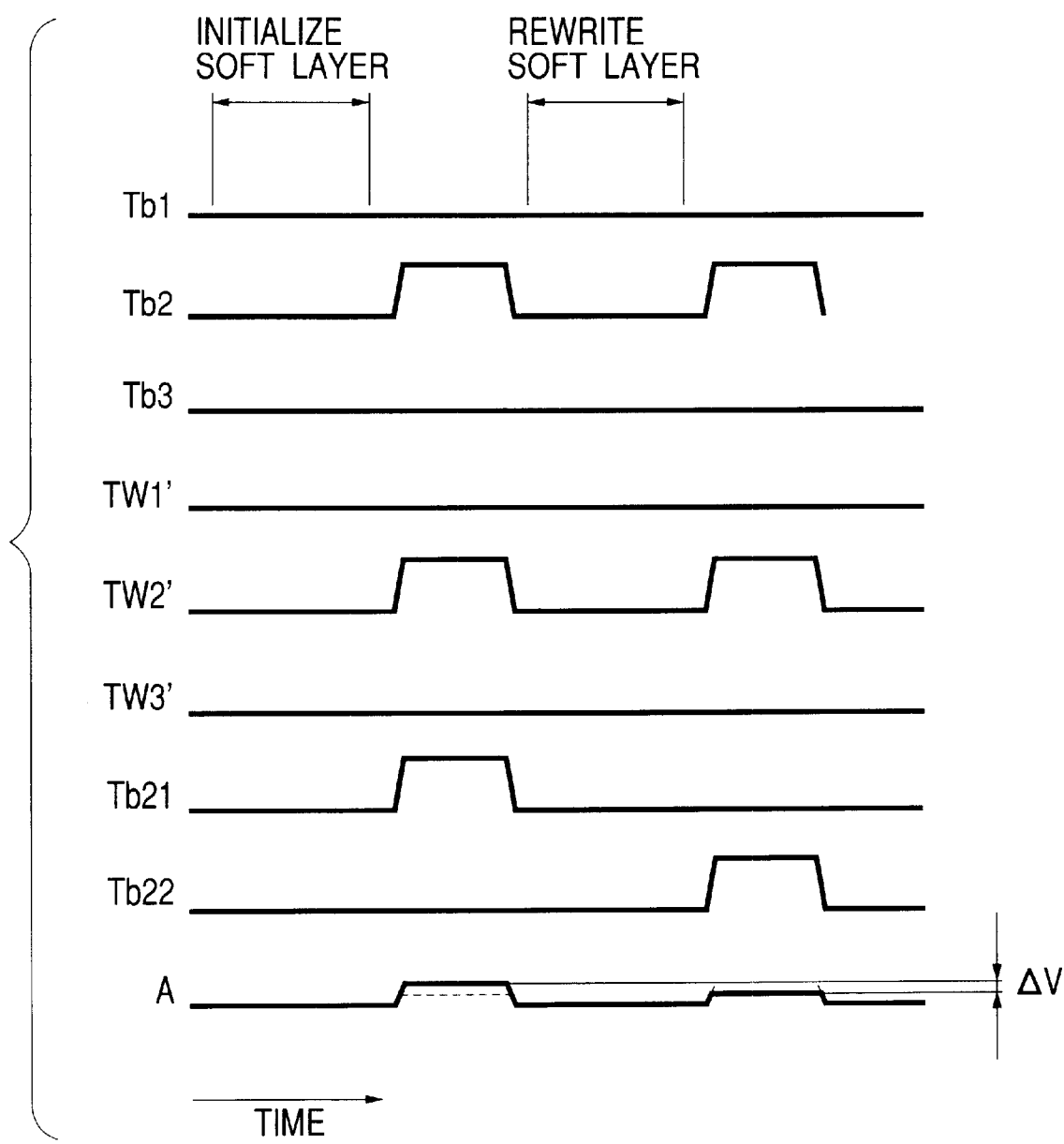
FIG. 16 is a timing chart showing an information reading operation in the third embodiment of the present invention.

FIG. 16 is a timing chart showing the foregoing operation for reading information from the nonvolatile solid-state magnetic memory of this embodiment. In this drawing, the voltage difference $\Delta V$ at the point "A" is the voltage difference detected by the sense amplifier SA2. In this example, the sense amplifier SA2 outputs "1" as a result of detection of the voltage difference $\Delta V$. However, if the direction of magnetization stored in the hard layer is opposite to the direction described above, the signal at the point "A" becomes as represented by the dotted line, so that the output from the sense amplifier SA2 becomes "0".

It should be noted here that it is preferable that a mechanism for suppressing or attenuating noise generated in the bit line is provided in the nonvolatile solid-state magnetic memory of this embodiment. For instance, as the mechanism for suppressing or attenuating noise generated in the bit line, the bit line is electrically floated or is grounded at low impedance. During the reading operation described above, if a current is applied to the write line in order to reverse the magnetization direction of the soft layer, there is a danger that a large spike noise due to the induced electromotive force is generated in the bit line and the signal detection is adversely affected. However, with the mechanism for suppressing or attenuating the noise, it becomes possible to suppress this effect.

Also, the bit line doubling as a write line and the write line may be made of materials whose main ingredient is copper. In this case, the reliability of current flowing during information writing is not impaired, so that it becomes possible to have the nonvolatile solid-state magnetic memory of this embodiment operate with stability for a long period.

Also, it is preferable that the channel portion of the field effect type transistor is made of SiGe and the semiconductor substrate is made of SOI (Silicon On Insulator). In this case, it becomes possible to have the memory of this embodiment operate at a higher speed than a memory having an ordinary MOS structure, thereby shortening a memory access time and the like of the nonvolatile solid-state magnetic memory.

On a trial basis, the cell area of the memory cell of this embodiment was compared with the cell area of a conventional 1T1R cell.

Here, it was assumed that these cells were ideally designed, so that the size of the TMR element with horizontal magnetization was set at 1F×3F ("F" is the minimum process size), the margin of alignment of contact holes was set at 0.5F, and the width of the element separating region was set at 1F. Under these conditions, the area of each memory cell was estimated.

Figure 17A:
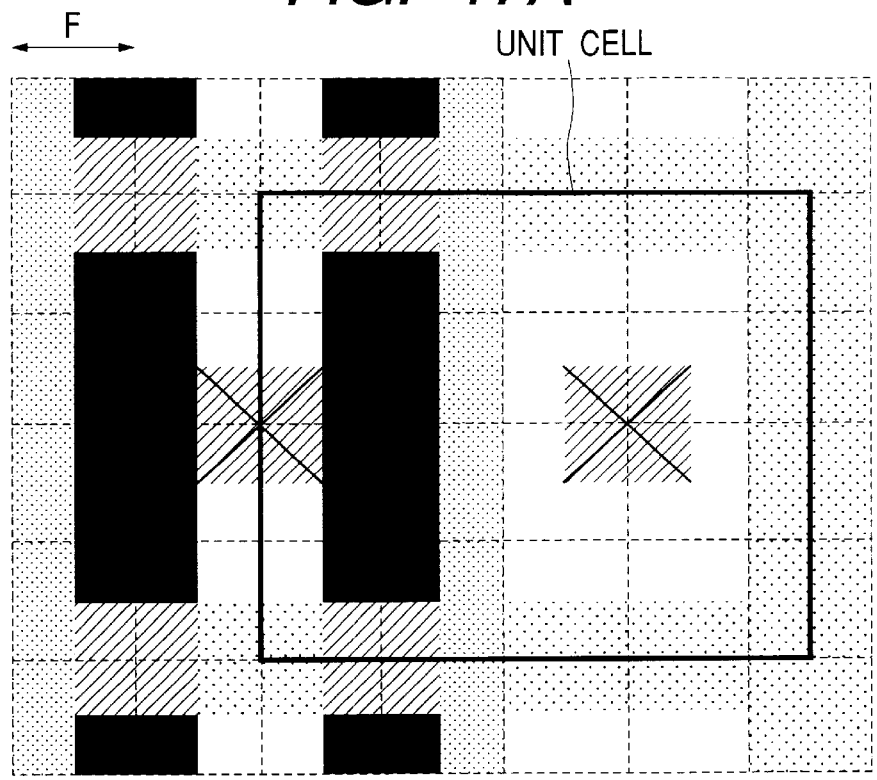
FIGS. 17A and 17B respectively show the layouts of a conventional memory cell and a memory cell in accordance with the third embodiment of the present invention in order to compare their cell areas.

FIG. 17A shows a layout of the 1T1R cell including a ground line shared by two cells and having the minimum cell area. The cell area of the 1T1R cell was estimated according to this layout. As a result of this estimation, the cell area was found as $18F^2$.

Figure 17B:
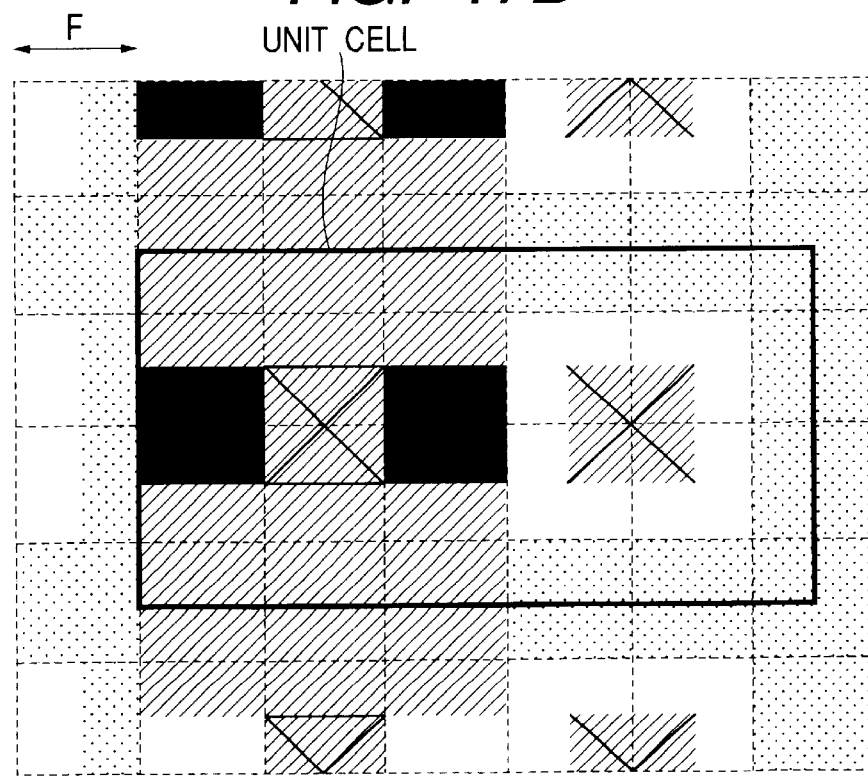

FIG. 17B shows a layout of the memory cell of this embodiment whose cell area was estimated in the same manner. As a result of this estimation, the cell area was found to be $16.5F^2$. This cell area is smaller than the cell area of the conventional 1T1R cell by around 10%.

Note that this difference in cell area is widened in the case of a 2T2R cell in which one cell is constructed using two TMR elements and two transistors or in the case where the area of a TMR element is increased due to the production process of the TMR element.

A method of producing a memory of this embodiment is described below.

Figure 18:
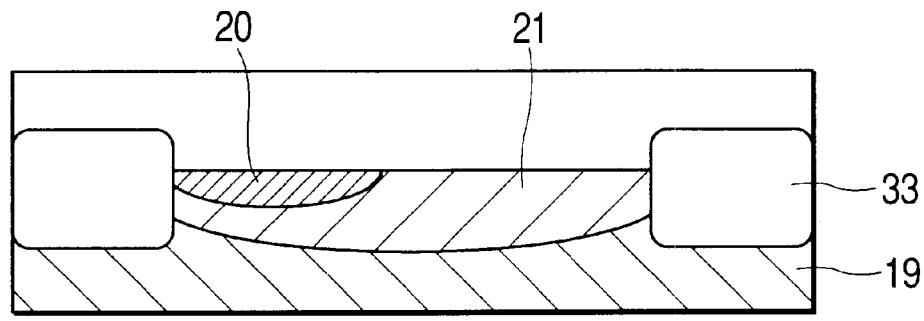
FIG. 18 illustrates a step for forming an interlayer insulating layer on a base substrate in the third embodiment of the present invention.

As shown in FIG. 18, a base substrate is prepared by forming, on an n-type silicon substrate 19, a buried type element separating region 33 made of $SiO_2$, a p-type diffusing region 21, and an n-type diffusing region 20, with the regions 20 and 21 constituting a PN junction diode. Then, an interlayer insulating film is formed. Note that, after the p-type diffusing region 21 and the n-type diffusing region 20 are formed, heat treatment is performed at around 950° C. to activate impurities diffused in an ion implantation process.

Figure 19:
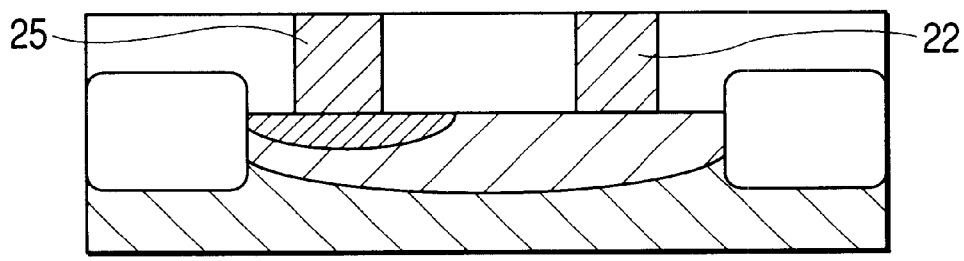
FIG. 19 illustrates a step for burying tungsten plugs in the third embodiment of the present invention.

Next, as shown in FIG. 19, tungsten plugs 22 and 25 are buried so as to respectively contact the p-type diffusing region 21 and the n-type diffusing region 20.

Figure 20:
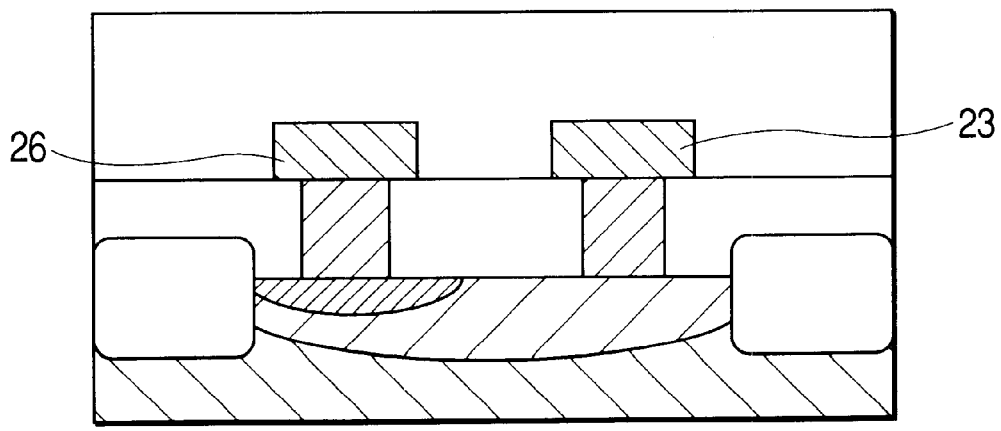
FIG. 20 illustrates a step for forming a via and a ground line in the third embodiment of the present invention.

Following this, as shown in FIG. 20, a Ti/AlSiCu/Ti layer is formed, a via 23 and a ground line 26 are formed in a photolithography process and an interlayer insulating film is further formed.

Figure 21:
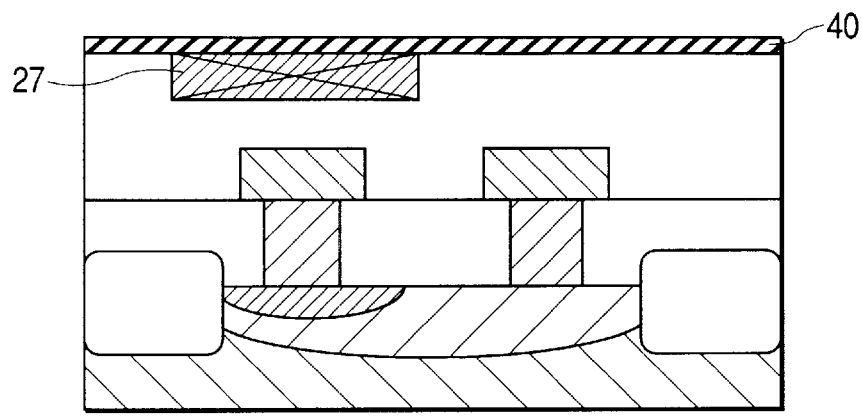
FIG. 21 illustrates a step for forming a write line in the third embodiment of the present invention.

Next, as shown in FIG. 21, after a groove is formed above the ground line 26, a copper write line 27 is formed in a copper burying step including a plating process, and a thin interlayer insulating film 40 is further formed.

Figure 22:
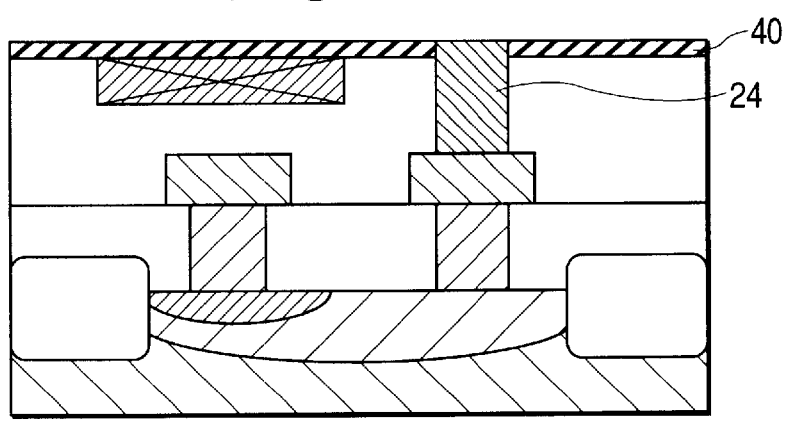
FIG. 22 illustrates a step for forming a tungsten plug contacting the via in the third embodiment of the present invention.

Then, as shown in FIG. 22, a contact hole is established above the via 23 and a tungsten plug 24 is formed and buried in the contact hole so as to contact the via 23.

Figure 23:
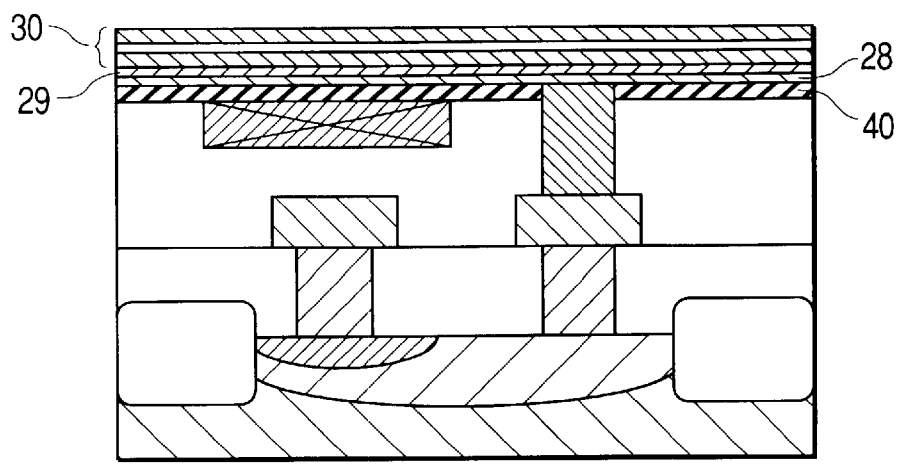
FIG. 23 illustrates a step for forming a TMR layer and other construction elements in the third embodiment of the present invention.

Next, as shown in FIG. 23, a local wiring layer 28 made of TiN, a lower portion electrode layer 29 made of AlCu, and a TMR element 30 made of a $Co/Al_2O_3/NiFe$ lamination layer are formed in this order. Note that the $Al_2O_3$ tunnel insulating film is around 2 nm in thickness and is produced by oxidizing Al metal in plasma.

Figure 24:
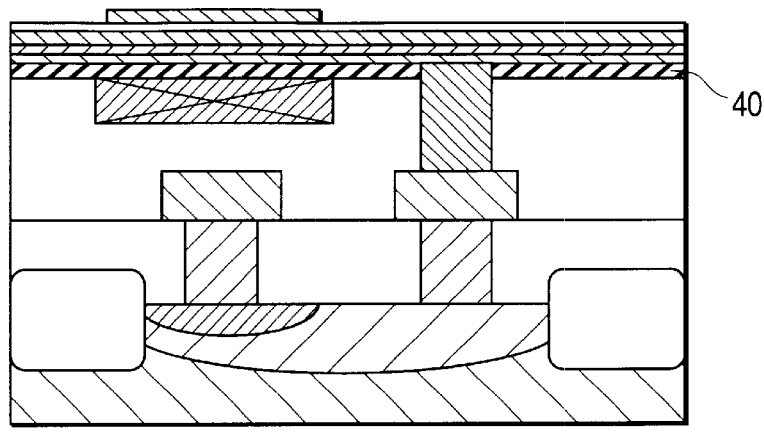
FIG. 24 illustrates a step for processing an upper portion electrode of the TMR layer in the third embodiment of the present invention.

Following this, as shown in FIG. 24, an upper portion electrode of the TMR layer 30 is processed in a desired shape in a photolithography process. This photolithography process is performed not to pass through the $Al_2O_3$ tunnel insulating film.

Figure 25:
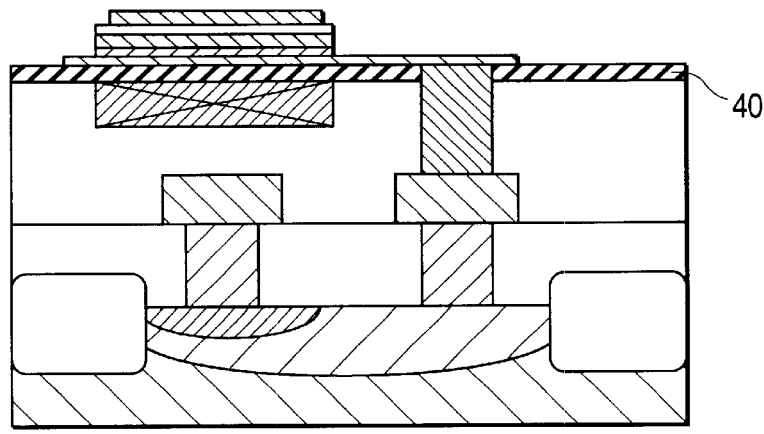
FIG. 25 illustrates a step for processing a tunnel insulating layer and a lower portion electrode in the third embodiment of the present invention.

Then, as shown in FIG. 25, the $Al_2O_3$ tunnel insulating film and the NiFe lower portion electrode 29 are processed by one operation so as to have the next larger size than the upper portion electrode in a photolithography process. Further, the local wiring layer 28 is processed in a desired shape in a photolithography process.

Figure 26:
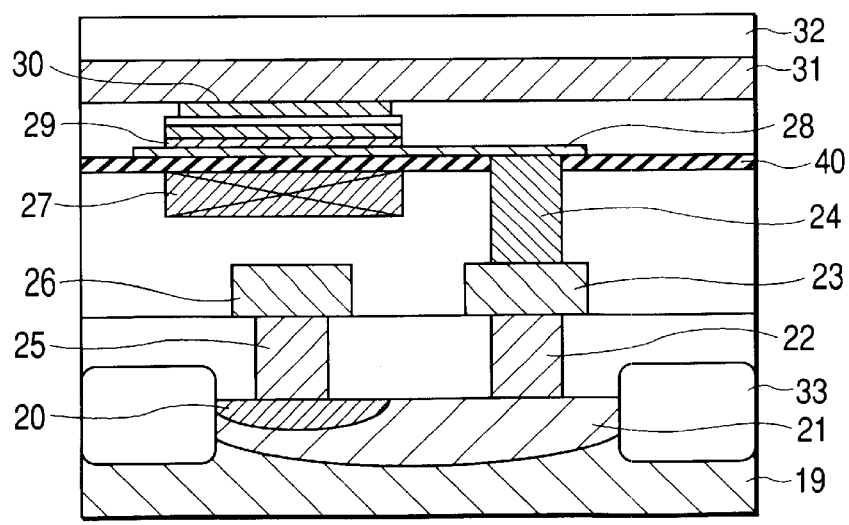
FIG. 26 illustrates a step for forming a protecting layer and establishing an opening in a pad portion in the third embodiment of the present invention.

Finally, as shown in FIG. 26, a protecting layer 32 made of $SiN/SiO_2$ is formed and an opening is established in a pad portion. In this manner, the memory of this embodiment is obtained.

Figure 27:
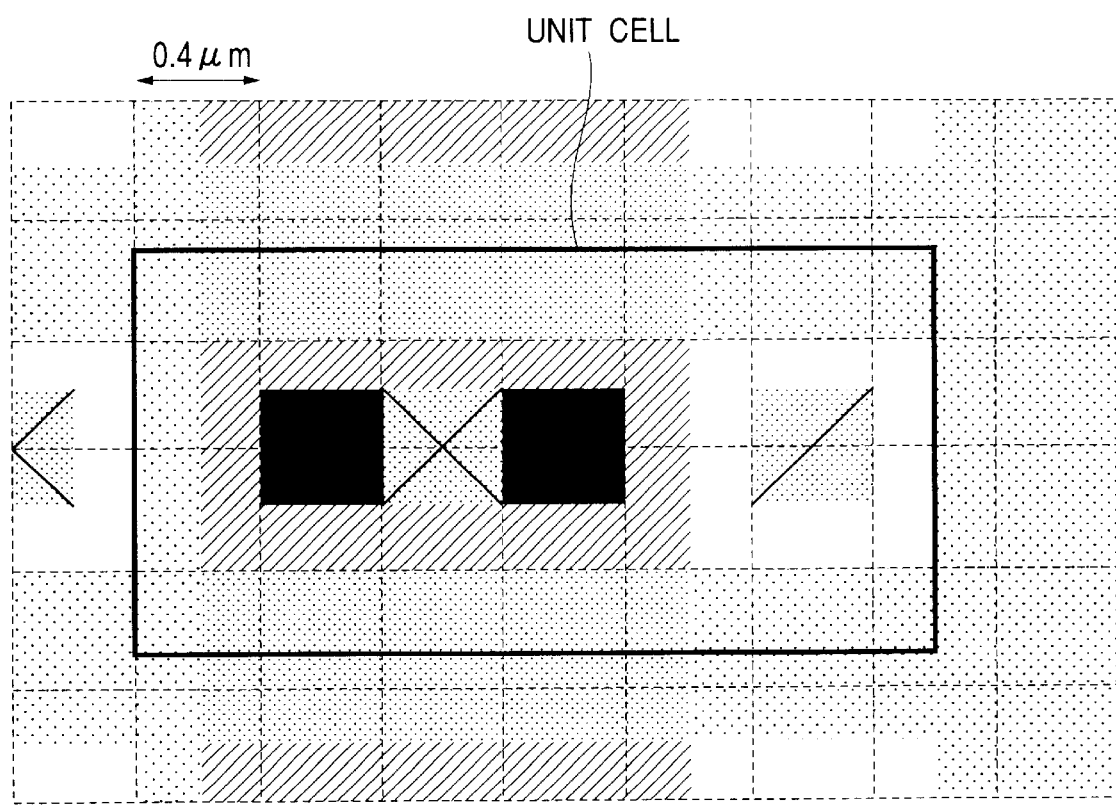
FIG. 27 is a schematic top view of the memory cell of the third embodiment of the present invention.

FIG. 27 is a schematic top view of a device produced in the manner described above. This trial device is a test sample that was designed under a 0.4 µm rule (meaning that the minimum process size is 0.4 µm) so as to include cells arranged to form a three by three matrix. In this device, the effective area of each TMR element was set at $0.4 \times 1.2$ µm$^2$, the base area of each TMR element was set at $0.6 \times 1.6$ µm$^2$, the margin of alignment in each photolithography process was set at 0.2 µm, the width of the element separating region was set at 0.3 µm, and the diameter of each contact hole was set at 0.4 µm. Under these conditions, there was obtained a cell area of around 3.64 µm$^2$.

When a conventional 1T1R type MRAM cell was designed using totally the same design rules so as to have a structure where a ground line is shared by two cells and the minimum cell area is obtained, there was obtained a cell area of around 4.2 µm$^2$. Also, when a conventional 2T2R type MRAM cell was designed in the same manner, there was obtained a cell area of around 8.4 µm$^2$.

As is apparent from this, the memory cell of this embodiment has a cell area that is smaller than that of a conventional memory cell.

Pulse signals of 0 V and 3.3 V were inputted from the outside to have the memory of this embodiment perform a differential operation. During this differential operation, a potential difference (corresponding to ΔV in FIG. 16) of around +/−20 mV was observed on the bit line. As a result of this experiment, it was confirmed that a reading operation was performed normally. Also, information was written by having currents flow through the bit line and the write line, and then a reading operation was performed. During this reading operation, it was confirmed that the code represented by the potential difference ΔV changed and the writing operation was performed normally.

Next, this memory cell was given a mechanism for suppressing or attenuating noise generated in the bit line. In more detail, in this memory cell, the bit line was electrically floated. Then, this memory cell was compared with a case where there were taken no measures against the noise and it was confirmed that the noise level observed during a differential reading operation was reduced to around $\frac{1}{20}$ of the case where there were taken no measures.

Also, a nonvolatile solid-state magnetic memory device was produced using field effect type transistors that use SiGe channels according to the same production process as above. This nonvolatile solid magnetic memory device was operated and it was confirmed that the access time for this memory device was shortened by around 10%.

Further, another nonvolatile solid-state magnetic memory device was produced on an SOI substrate according to the same production process as above. In this case, the access time was shortened by around 20%.

Figure 28:
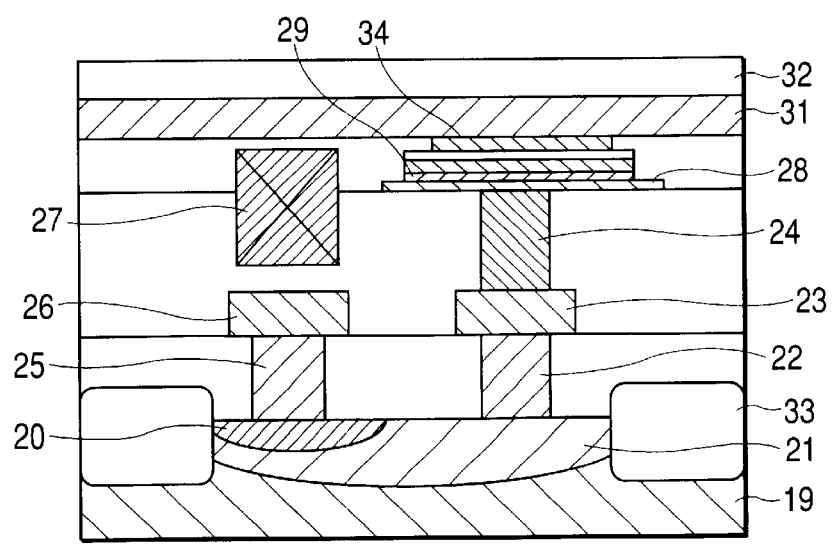
FIG. 28 concerns a case where a magnetic film with vertical magnetization is used as a TMR element in the third embodiment of the present invention.

Also, the construction shown in FIG. 28 was obtained by forming the TMR layer 33 using a GdFe/Co/Al$_2$O$_3$/Co/GdFe lamination film. It was confirmed that this memory cell also properly performed both of a reading operation and a writing operation. Here, it is preferable that the vertical magnetization film described above is used because it becomes possible to miniaturize a memory cell. In this case, during information writing, it is possible to reverse magnetization of the hard layer by applying a magnetic field in the film plane vertical direction using the write line and by applying a magnetic field in the in-plane direction using the bit line. Therefore, current required for magnetization reversal is reduced because both of the magnetic fields in the film plane vertical direction and in the in-plane direction are applied. As a result, this structure achieves low power consumption and therefore is preferable.

Also, by mounting the nonvolatile solid-state magnetic memory of this embodiment on a memory chip, a portable communication device, a personal computer device, or the like, there is obtained a small-sized nonvolatile memory where information is not lost even if power supply is interrupted. As a result, there is realized a small-sized nonvolatile solid magnetic memory, which is usable under a condition where power supply is unstable.

For instance, with a conventional technique, an SRAM (Static Random Access Memory) has been used as a work memory by backing up information in the SRAM using a battery. However, it is possible to use the nonvolatile solid-state magnetic memory of this embodiment without using a battery for backup. As a result, by using the present magnetic memory instead of the SRAM, it becomes possible to miniaturize a device and to use the device under a condition where power supply is unstable. In addition, because backing up of information in the memory is unnecessary, the present magnetic memory contributes to the reduction of power consumption.

Also, instead of a NOR type flash memory having been used as a program memory for recording a software program, the nonvolatile solid-state magnetic memory of this embodiment may be used which is capable of rewriting information several digits faster than the NOR type flash memory. In this case, it is possible to markedly improve the easiness of rewriting a program installed in a portable communication device, a portable personal computer, or the like.

With the technique of this embodiment, it is possible to have an MRAM having a simple matrix type structure and a small cell area operate with stability. As a result, it is possible to realize a small-sized nonvolatile memory that operates with stability.

<Fourth Embodiment>

This embodiment is characterized in that there is provided a means for eliminating noise generated during the reversal of magnetization of a soft layer. During the magnetization reversal for the soft layer from the first magnetization direction to the second magnetization direction, noise is generated by the electromagnetic induction caused by the magnetic field applied from a write line to a bit line. There may be cases where this noise hinders the signal detection operation of a sense amplifier. To prevent this problem, a noise eliminating means is provided in this embodiment.

Figure 29A:
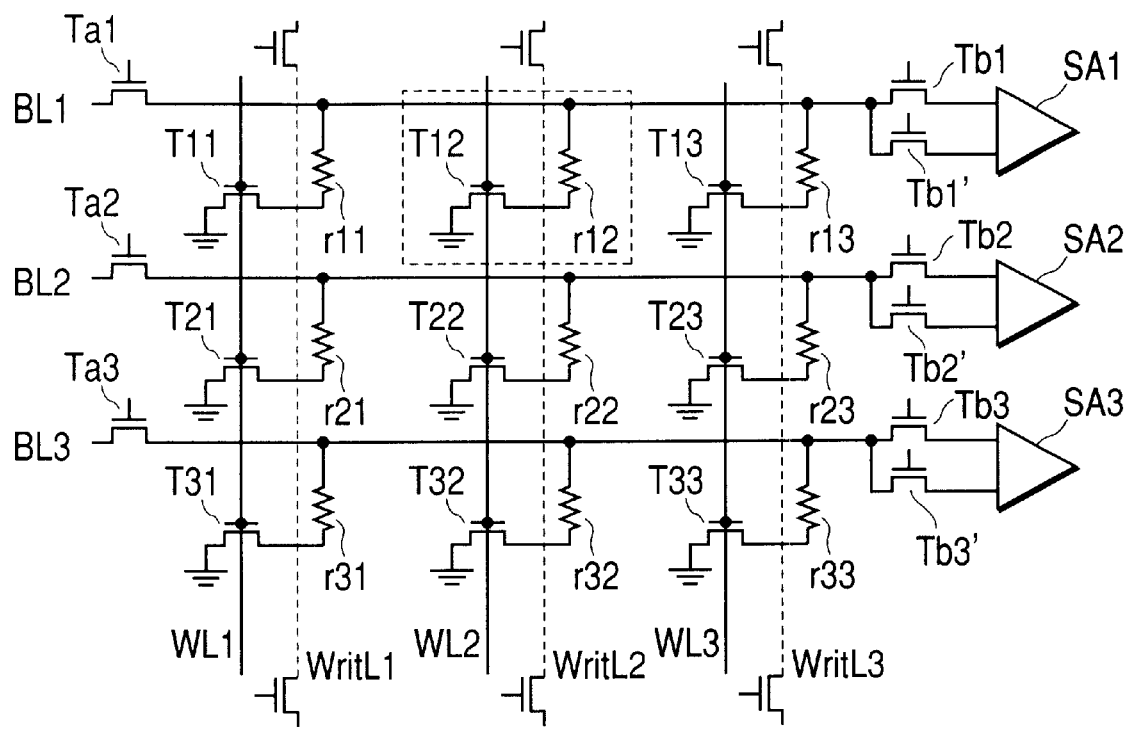
FIGS. 29A and 29B are each an equivalent circuit diagram of a magnetic memory in accordance with a fourth embodiment of the present invention.
Figure 30:
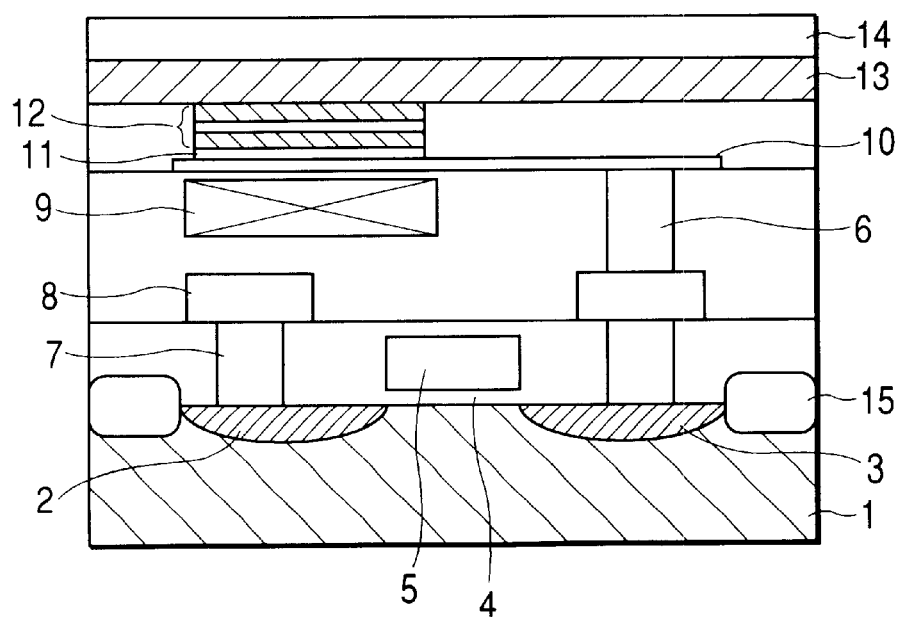
FIG. 30 shows the structure of a memory cell of the magnetic memory in accordance with the fourth embodiment of the present invention.

FIG. 29A is an equivalent circuit diagram showing the structure of a nonvolatile solid-state magnetic memory of this embodiment. FIG. 30 is a partial cross-sectional view showing the structure of a memory cell of the nonvolatile solid-state magnetic memory shown in FIG. 29A. The construction elements having the same functions as in FIGS. 1 and 4 are given the same reference numerals and are not described in this embodiment.

Figure 29B:
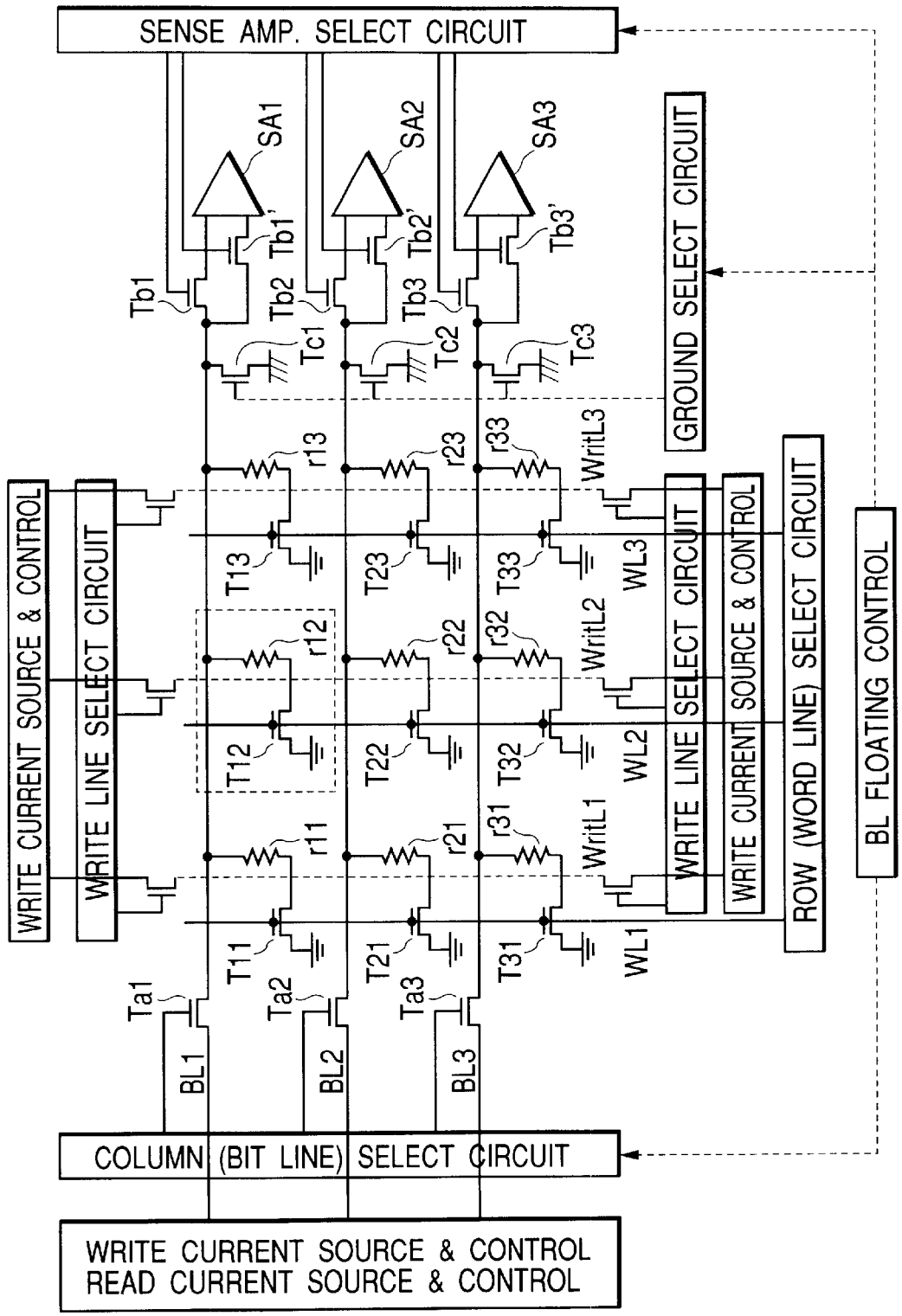

In this embodiment, there may be provided a control units "BL Floating Control" as shown in FIG. 29B for electrically floating bit lines (BL1 and BL3) by controlling transistors ("Ta1, Tb1, Tb1'", "Ta2, Tb2, Tb2'", and "Ta3, Tb3, Tb3'") through each of select circuits to eliminate the effect of noise generated in the bit lines due to magnetization reversal performed during an information reproducing operation.

Each memory cell has the same structure. In this embodiment, the structure of the memory cell (having an address (1, 2)) surrounded by a broken line in FIGS. 29A and 29B is described specifically. This memory cell is a cell having a 1T1R structure where one field effect type transistor T12 and one variable resistor r12 are used.

In the field effect type transistor, a predetermined voltage is applied to a gate electrode 5 and the carrier density in the region immediately below the gate electrode 5 (between a source 2 and a drain 3) is controlled, thereby controlling current flowing between the source 2 and the drain 3 and a turning on/off operation. The source 2 is electrically connected to a ground line 8 via a source contact plug 7, while the drain 3 is electrically connected to a local wire 10 via a drain contact plug 6. This memory cell is insulated from its adjacent memory cells by a field oxidized film 15.

There is provided a write line 9 (corresponding to the write line WritL2 in FIG. 29A) above the ground line 8. Here, the write line 9 extends along the ground line 8. Also, the write line 9 and the ground line 8 are insulated from each other. The write line 9 overlaps the foregoing local wire 10 in part and is insulated from the local wire 10. In the portion in which the write line 9 overlaps the local wire 10, the local wire 10 is positioned above the write line 9 and a variable resistor 12 (corresponding to the variable resistor r12 in FIGS. 29A and 29B) is formed above the local wire 10.

The upper surface of the variable resistor 12 contacts a bit line 13 (corresponding to the bit line BL1 in FIGS. 29A and 29B) and the lower surface of the variable resistor 12 contacts a terminal 11 that is electrically connected to the local wire 10. There is formed an insulating film 14 on the bit line 13. The resistance value of the variable resistor 12 is changed by selecting the magnetization direction of a magnetic film by applying an external magnetic field. For instance, a GMR element or a CMR element described above may be used as the variable resistor, although it is preferable that a TMR element is used as the variable resistor because the TMR element has a high magneto-resistance change rate.

Next, a method of reproducing information stored in the magnetic memory of this embodiment is described in brief. Note that the detailed information reproduction method is the same as that described in the foregoing embodiments.

In the nonvolatile solid-state magnetic memory of this embodiment, a reading operation based on a 1T1R type differential scheme is performed. The following description concerns a case where information is read from the memory cell surrounded by the broken line in FIGS. 29A and 29B (the memory cell at the position addressed (1, 2)).

FIGS. 31 to 34 are each a schematic diagram illustrating the reading operation of the memory cell at the position addressed (1, 2) in the nonvolatile solid-state magnetic memory shown in FIGS. 29A and 29B.

Figure 31:
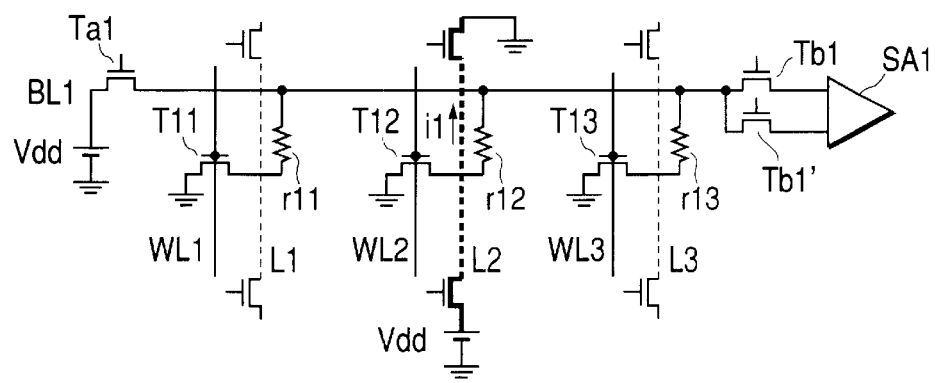
FIG. 31 is a schematic diagram illustrating an operation for reading information from the memory cell positioned at an address (1, 2) of the magnetic memory in accordance with the fourth embodiment of the present invention shown in FIGS. 29A and 29B.

First, as shown in FIG. 31, initialization is performed by magnetizing the soft layer of the variable resistor r12 in a predetermined direction. The magnetization state during this initialization is briefly described below.

Figure 35A:
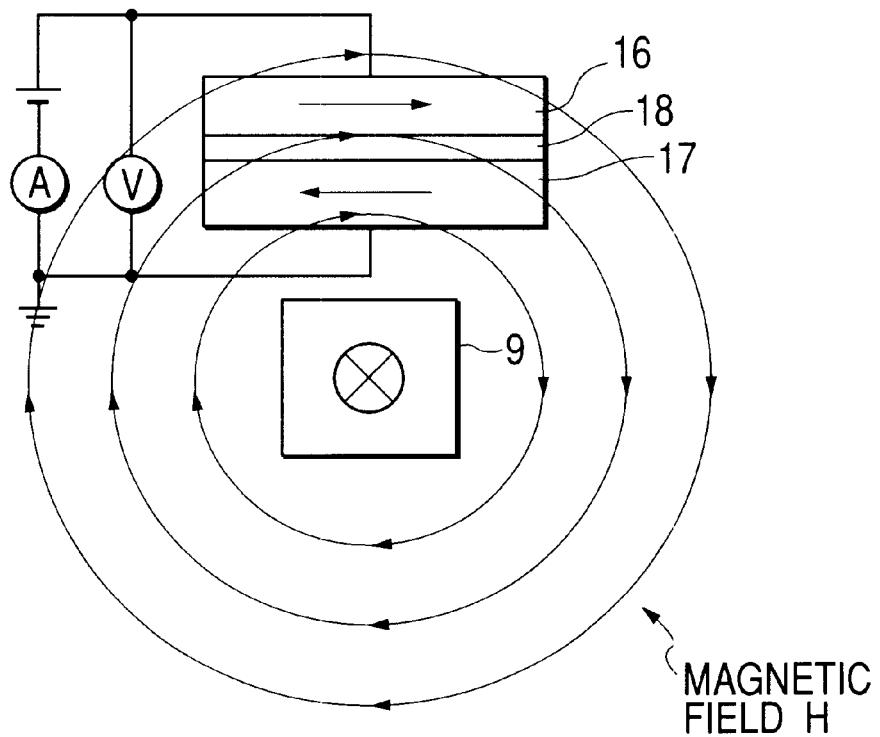
FIGS. 35A and 35B are each a schematic diagram showing a state where a soft layer of a TMR element is magnetized in the horizontal direction by a magnetic field generated by a write current.
Figure 35B:
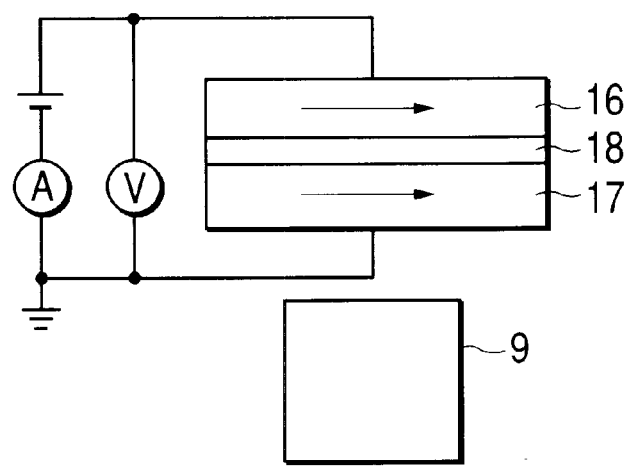

FIGS. 35A and 35B concern a case where the variable resistor r12 is a TMR element whose magnetic films are magnetized in the horizontal direction. These drawings are each a schematic diagram illustrating a state where a soft layer of the TMR element is magnetized by a magnetic field generated by a write current. In this example, when write current "i" is applied to the write line 9, a magnetic field H is generated as shown in FIG. 35A and this magnetic field H reverses the magnetization of the soft layer 17. As a result, as shown in FIG. 35B, the soft layer 17 and the hard layer 16 are magnetized in the same direction. To further reverse the magnetization of the soft layer 17, the direction of the write current "i" flowing through the write line 9 is reversed.

Figure 36A:
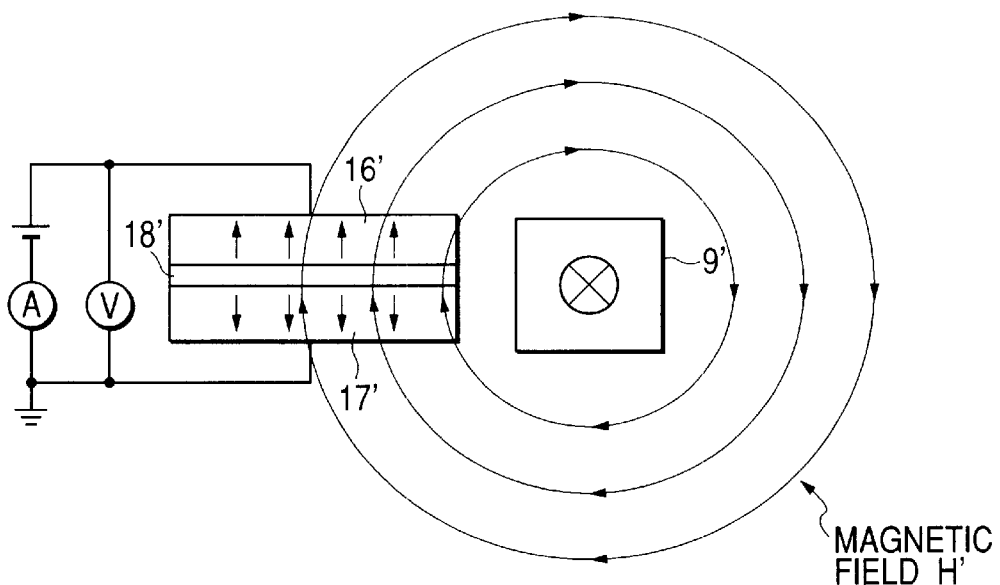
FIGS. 36A and 36B are each a schematic diagram showing a state where a soft layer of a TMR element is magnetized in the vertical direction by a magnetic field generated by a write current.
Figure 36B:
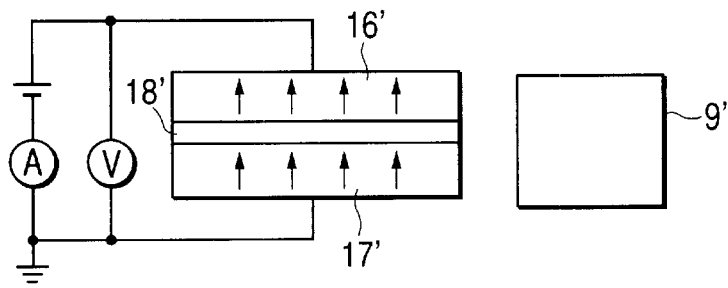

FIGS. 36A and 36B concern a case where the variable resistor r12 is a TMR element whose magnetic films are magnetized in the vertical direction. These drawings are each a schematic diagram illustrating a state where a soft layer of the TMR element is magnetized by a magnetic field generated by a write current. In this example, unlike the case shown in FIGS. 35A and 35B, a magnetic field H' generated by the write current i flowing through the write line 9' causes magnetization of the soft layer 17' in the film plane vertical direction.

The reversal of the magnetization of the soft layer 17' is caused by the application of this magnetic field H'. As a result, as shown in FIG. 36B, the soft layer 17' and the hard layer 16' are magnetized in parallel and in the same direction. To further reverse the magnetization of the soft layer 17', the write current i flowing through the write line 9' is reversed.

Figure 32:
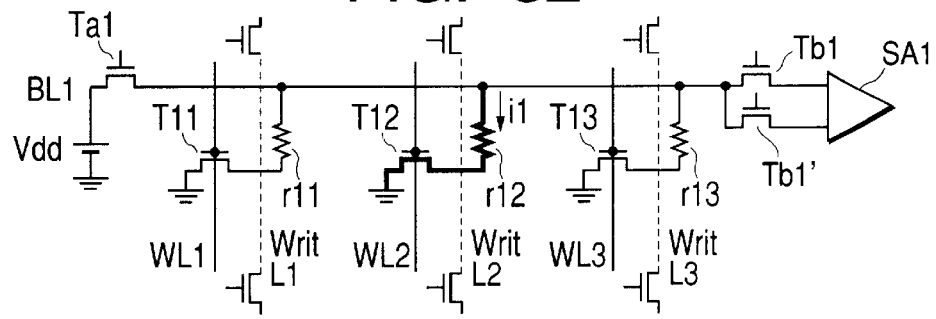
FIG. 32 is another schematic diagram illustrating the operation for reading information from the memory cell positioned at the address (1, 2) of the magnetic memory in accordance with the fourth embodiment of the present invention shown in FIGS. 29A and 29B.

As shown in FIG. 32, after the initialization, a steady-state current (feedthrough current) i1 is applied to the variable resistor r12 and a terminal (the − terminal) of the sense amplifier is charged with a potential of the bit line BL1.

Figure 33:
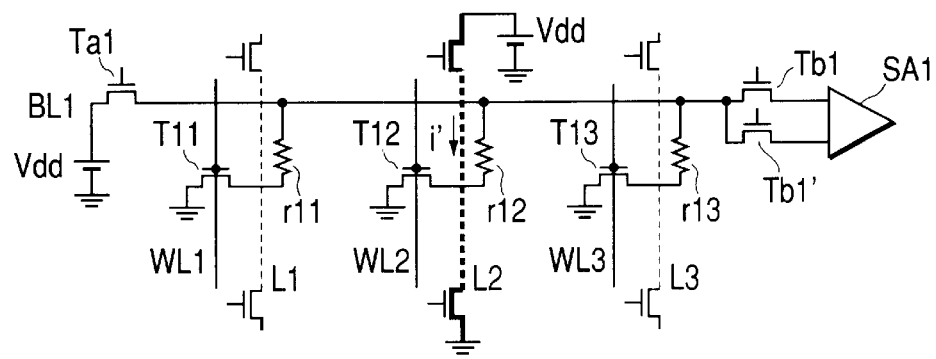
FIG. 33 is still another schematic diagram illustrating the operation for reading information from the memory cell positioned at the address (1, 2) of the magnetic memory in accordance with the fourth embodiment of the present invention shown in FIGS. 29A and 29B.

Next, as shown in FIG. 33, a write current i' is applied to the write line WritL2 (the write line 9 in FIG. 30) in a direction opposite to the current flow direction during the initialization shown in FIG. 31, thereby reversing the magnetization of the soft layer. In more detail, there is caused the magnetization reversal opposite to the magnetization reversal described with reference to FIGS. 35A, 35B, 36A and 36B.

During this magnetization reversal, there occurs noise in the bit line BL1 due to electromagnetic induction. To suppress the occurrence of noise in the bit line BL1 due to electromagnetic induction, all transistors connected to the bit line BL1 are turned off, thereby electrically floating the bit line BL1.

Figure 34:
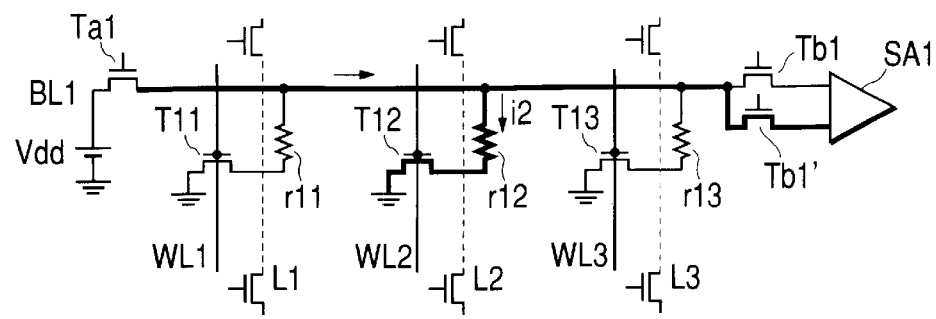
FIG. 34 is further another schematic diagram illustrating the operation for reading information from the memory cell positioned at the address (1, 2) of the magnetic memory in accordance with the fourth embodiment of the present invention shown in FIGS. 29A and 29B.

Next, as shown in FIG. 34, a steady-state current (feedthrough current) i2 is applied to the variable resistor r12 and the other terminal (the + terminal) of the sense amplifier is charged with a potential of the bit line BL1.

As a result of these operations, the +terminal of the sense amplifier SA1 holds a voltage in a case where the hard layer and the soft layer are magnetized in the same direction in parallel, while the − terminal of the sense amplifier SA1 holds a voltage in a case the hard layer and the soft layer are magnetized in the different direction in opposite parallel. In this case, because + terminal voltage>− terminal voltage, the output from the sense amplifier SA1 is at a high level (that is, Vdd).

On the other hand, in the case where the hard layer is magnetized in an opposite direction, because + terminal voltage<− terminal voltage, the output from the sense amplifier SA1 is at a low level (that is, 0V). In this manner, information reading is performed on the basis of the magnetization direction of the hard layer.

Figure 37:
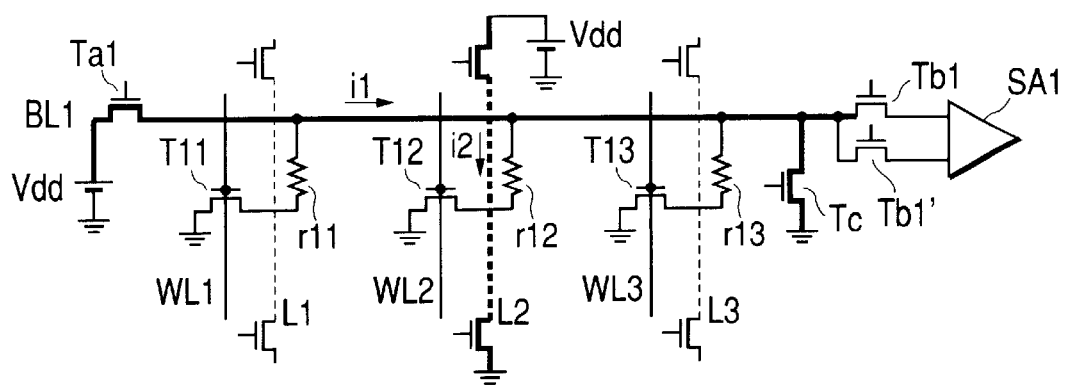
FIG. 37 is a schematic diagram showing the flow of a write current during the rewrite of information in a cell positioned at the address (1, 2) in the matrix shown in FIGS. 29A and 29B.
Figure 38B:
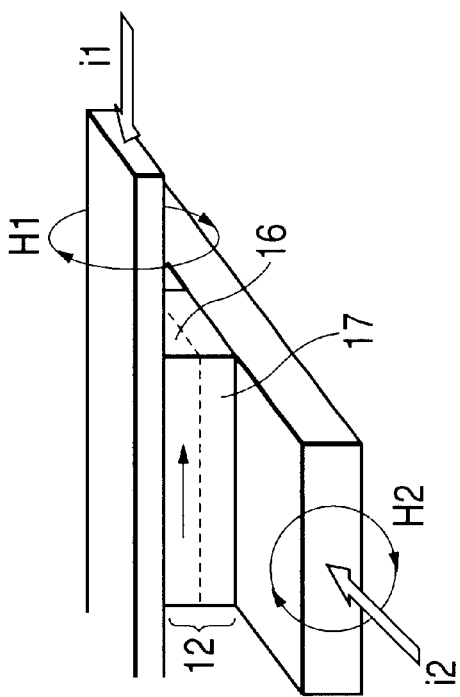
FIGS. 38A, 38B and 38C each show a state where magnetization of a memory cell is reversed during the information rewrite shown in FIG. 37, where
Figure 38A:
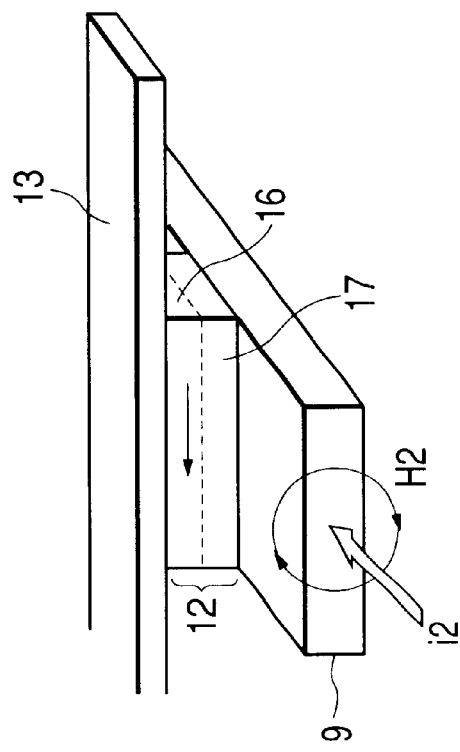
Figure 38C:
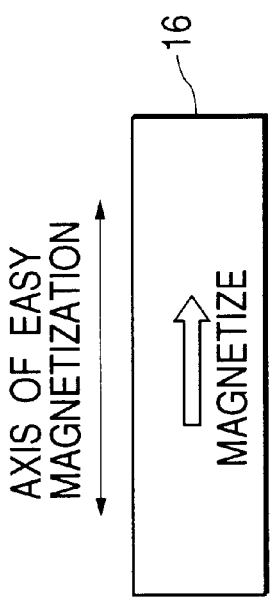

The following description concerns an operation for writing information into a memory cell. In the following description, the hard layer is used as a magnetic layer for holding information. FIG. 37 is a schematic diagram showing the flow of a write current during the rewrite of information in a cell at the position addressed (1, 2) in the matrix. FIGS. 38A to 38C illustrate a state where the magnetization in the memory cell is reversed during the writing operation shown in FIG. 37. FIG. 38A is a schematic diagram showing the magnetization state in the case where a current flows through the write line in a predetermined direction. FIG. 38B is a schematic diagram showing the magnetization state in the case where another current also flows through the bit line in a predetermined direction. FIG. 38C is a schematic top view of a magnetic resistor placed in the state shown in FIG. 38B. In FIGS. 38A to 38C, the same construction elements as in FIGS. 29A and 29B are given the same reference numerals. The magnetization reversal of the memory cell during information writing is described below with reference to FIGS. 37 and 38A to 38C.

During information rewriting, as shown in FIGS. 38A to 38C, currents are applied to the bit line BL1 and the write line WritL2, thereby generating a synthesized magnetic field from these currents. This synthesized magnetic field changes the magnetization direction of the hard layer. When a write current i2 is applied to the write line 9, a write magnetic field H2 is generated. However, as shown in FIG. 38A, the magnetization direction of the hard layer 16 of the variable resistor (TMR element) 12 is not reversed only by this write magnetic field H2. In this example, it is assumed that the hard layer 16 is magnetized in advance in a direction opposite to the direction of the supplied write magnetic field H2. Also, the axis of easy magnetization of the variable resistor 12 extends in a direction parallel to the direction of the magnetic field component of the write magnetic field H2 (that is, parallel to the bit line 13).

When a write current i1 is applied to the bit line 13 under a condition where the write magnetic field H2 is applied, a write magnetic field H1 is generated and a synthesized magnetic field of these write magnetic fields H1 and H2 is applied to the variable resistor 12. The magnetization of the hard layer 16 of the variable resistor 12 is reversed only when both of the write magnetic fields H1 and H2 are applied at the same time in this manner (see FIGS. 38B and 38C).

In this embodiment, even if a current is applied to only one of the write line 9 and the bit line 13, the magnetization direction of the hard layer 16 of the variable resistor 12 is not reversed. That is, only if currents are applied to both of these lines at the same time, the magnetization direction of the hard layer 16 is reversed. This makes it possible to selectively reverse the magnetization of desired variable resistors among variable resistors arranged in a matrix manner. Note that for ease of explanation, FIGS. 38A to 38C show only the magnetization reversal of the hard layer 16 and does not show the magnetization reversal of the soft layer 17. When the write current i2 is applied and the magnetic field H2 generated by this current is supplied, the soft layer 17 is magnetized in the direction of the magnetic field H2.

In the above description, a writing operation is described on the assumption that the variable resistor (TMR element) 12 is magnetized in the horizontal direction with reference to in-planes. Even in the case of a TMR element having a vertical magnetization structure, information writing is performed in the same manner. In this case, however, the write line needs to be arranged so that a magnetic field is applied to the TMR element in the film plane vertical direction. Also, the magnetic field generated by the bit line is applied to the TMR element in the film in-plane direction and is used as an auxiliary magnetic field. In this case, it is possible to reduce the strength of the vertical magnetic field generated by the write line using the magnetic field generated in the film in-plane direction. Therefore, it is preferable to use a TMR element having a vertical magnetization structure because this TMR element contributes to the reduction of power consumption. Needless to say, the element selection may be performed using a synthesized magnetic field generated only from magnetic fields in the film plane vertical direction.

In this embodiment, noise generated in the bit line by electromagnetic induction is suppressed or attenuated by electrically floating the bit line. However, the suppression or attenuation of this noise may be realized using various other techniques. For instance, the bit line may be grounded at low impedance. Also, an inductance may be provided for the bit line.

Figure 39:
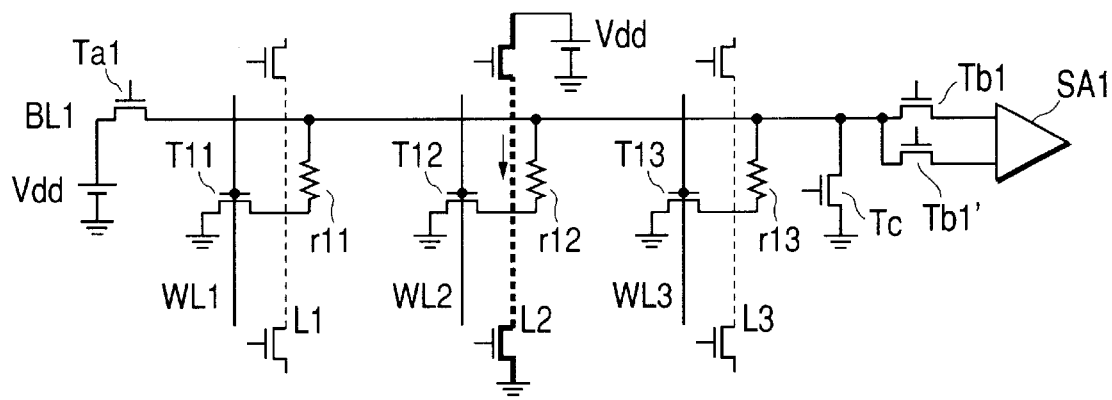
FIG. 39 is an equivalent circuit diagram showing an example of a magnetic memory in which a bit line is grounded at low impedance.

Further, as shown in FIG. 39, the bit line may be grounded at low impedance. In this drawing, the same construction elements as in FIGS. 29A and 29B are given the same reference numerals. In this case, a portion of the bit line BL1 to which the transistors Tb1 and Tb1' are commonly connected is grounded via the transistor Tc. The value of the on-resistance of the transistor Tc is sufficiently lower than those of the transistors Ta1, Tb1, and Tb1'.

In this case, when magnetization is reversed during information reproduction, the transistor Tc is turned on by a control unit (not shown), thereby leading noise generated in the bit line to the ground.

Figure 40:
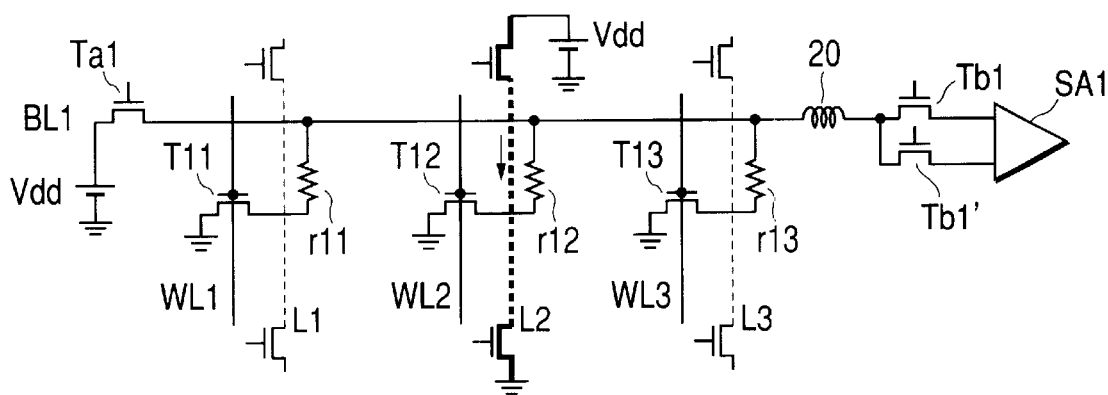
FIG. 40 is a circuit diagram showing an example of a magnetic memory in which a bit line is provided with an inductance.

Also, as shown in FIG. 40, an inductance may be provided for the bit line. In this drawing, the same construction elements as in FIG. 19 are given the same reference numerals. In this example, a coil (inductance) L is provided for a line in a portion of the bit line BL1 to which the transistors Tb1 and Tb1' are commonly connected. This coil L functions as a noise eliminating filter, thereby attenuating noise generated in the bit line due to electromagnetic induction.

<Fifth Embodiment>

In this embodiment, the production process and structure of a nonvolatile solid-state magnetic memory are described in detail.

FIGS. 41A to 41G are cross sectional views showing the production process of a memory cell of the nonvolatile solid-state magnetic memory.

Figure 41A:
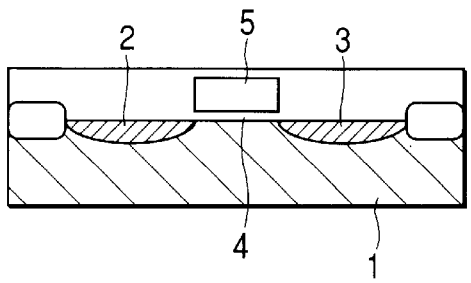
FIGS. 41A, 41B, 41C, 41D, 41E, 41F and 41G are each a cross sectional view showing the procedure for producing a memory cell of the magnetic memory shown in FIG. 30.

First, as shown in FIG. 41A, a source 2, a drain 3, a gate insulating film 4, and a gate electrode 5 are formed on a semiconductor substrate 1, thereby producing a substrate including a MOS (Metal-Oxide Semiconductor)-FET (Field Effect Transistor). Then, contact holes 7 and 6 are respectively established in the source 2 portion and the drain 3 portion of the FET on this substrate and plugs are buried in these contact holes 7 and 6 (see FIG. 41B). A Ti barrier film is used as a base film.

Following this, after a Ti/AlSiCu/Ti layer is formed as a wiring layer, this layer is processed in a predetermined pattern by performing a known photolithography process, thereby forming ground lines 8 and a plug connection portion. Then, an SiO$_2$ film 20 is formed using a known plasma CVD method to obtain an interlayer insulating film, and the upper surface of this film is flattened (see FIG. 41C).

Next, a Ti/AlSiCu/Ti layer is formed as a wiring layer and is processed in a predetermined pattern by performing a known photolithography process, thereby forming a write line 9. Then, an SiO$_2$ film 21 is formed using a known plasma CVD method to obtain an interlayer insulating film, and the upper surface of this film is flattened (see FIG. 41D).

Figure 41E:
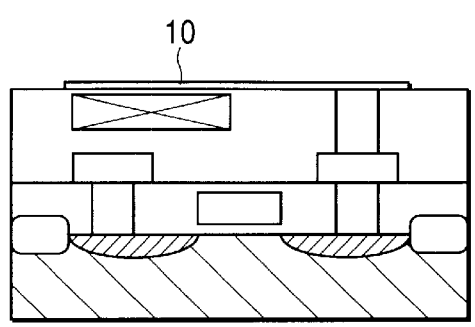
Figure 41B:
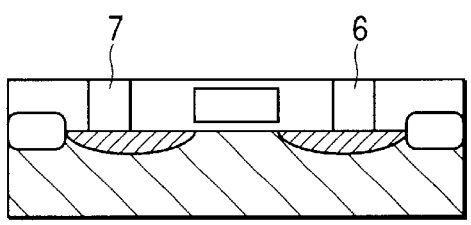
Figure 41F:
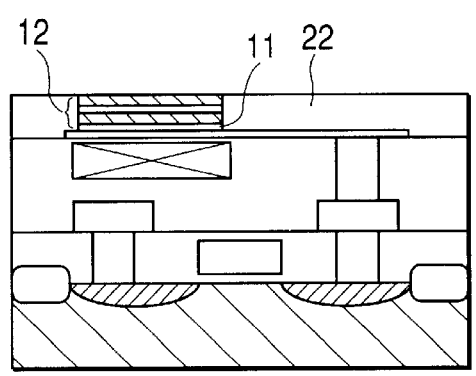
Figure 41C:
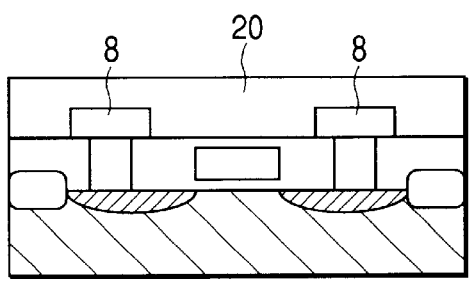
Figure 41G:
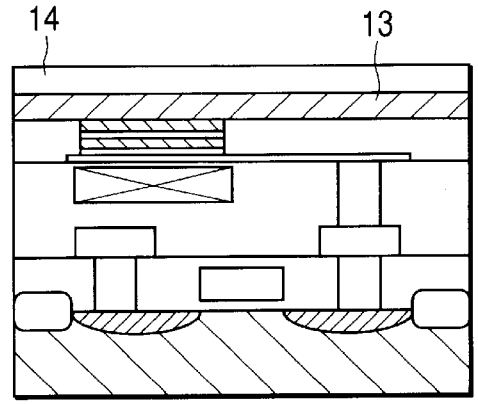
Figure 41D:
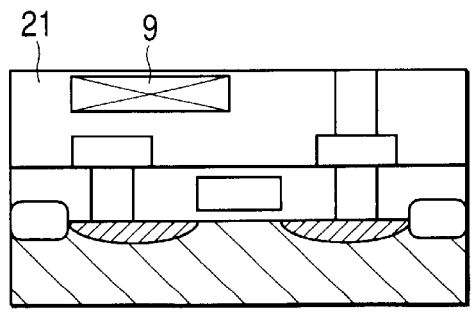

Next, a W (tungsten) layer is formed as a connection line to a TMR element and is processed in a predetermined pattern by performing a photolithography process, thereby forming a local wire 10 (see FIG. 41E). Then, an AlCu layer is formed as a base layer from which the terminal 11 is produced, and an NiFe/AlOx/Co lamination film is formed as a variable resistor (TMR element) 12. These layers are processed in predetermined patterns by performing a photolithography process. Then, an SiO$_2$ film 22 is formed using the plasma CVD method and the upper surface of this film is flattened (see FIG. 41F).

Following this, a Ti/AlSiCu/Ti layer is formed and processed in a predetermined pattern by performing a photolithography process, thereby obtaining a bit line 13. Then, an SiO$_2$ film and an insulating film (SiN film) 14 are respectively formed as an interlayer insulating film and a protecting layer with the plasma CVD method. Finally, a pad region is processed (see FIG. 41G). In this manner, the memory cell of the nonvolatile solid-state magnetic memory is obtained.

In the case where vertical magnetization films are used as a TMR element, the write line 9 is arranged so that a magnetic field is applied to the TMR element in the film plane vertical direction. In this case, the local wire formed in FIG. 41E is not provided and the TMR element is provided immediately above the drain region 3. This structure is preferable because it is possible to simplify the memory structure and miniaturize the memory cell.

Figure 42:
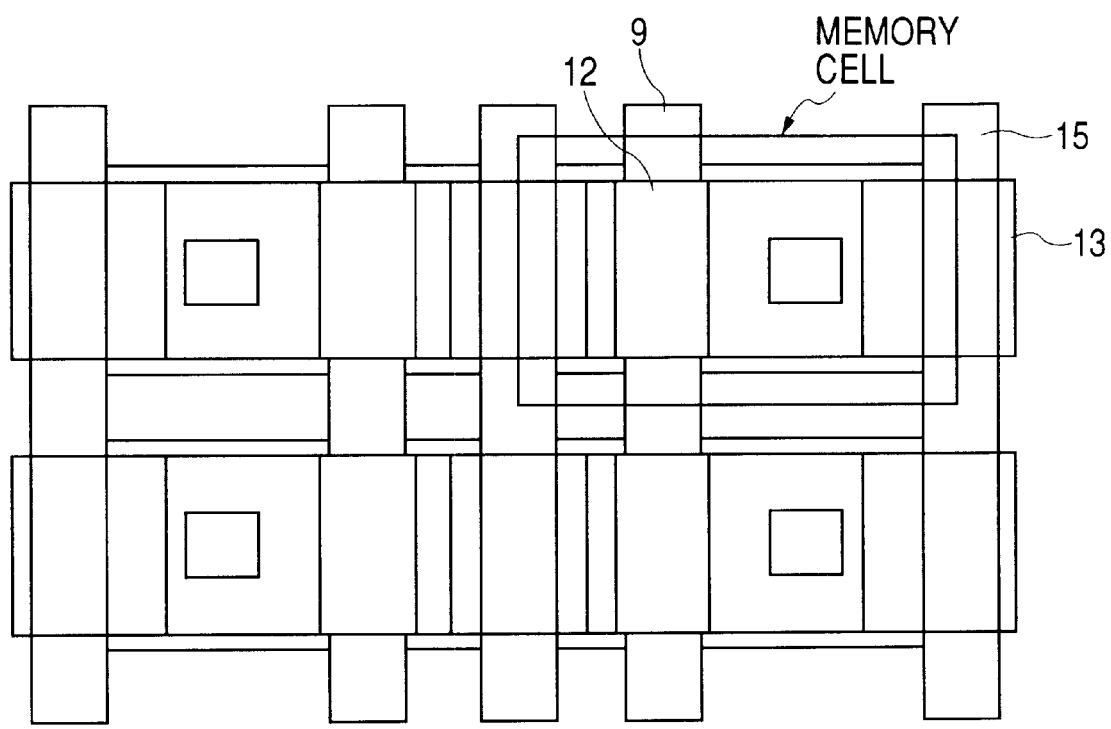
FIG. 42 is a top view of the memory cell produced according to the process shown in FIGS. 41A to 41G.

FIG. 42 is a top view of a memory cell produced under predetermined design rules according to the production process described above. The variable resistor 12 is formed in a portion in which the bit line 13 and the write line 9 overlap each other.

In the case where the bit line of the nonvolatile solid-state magnetic memory produced in the aforementioned manner is electrically floated in order to suppress or attenuate noise generated in the bit line, the noise level observed during a differential reading operation is reduced to around ¹⁄₂₀ of that observed in the case where there are taken no measures against the noise.

Also, in the case where the bit line and the write line are formed using a plating method and are buried using a CMP (Chemical Mechanical Polishing) method to obtain copper wires, the electromigration resistance is improved by one or more digits. This electromigration is briefly described below.

It is generally known that when currents with high current densities are applied to wires, there occurs a phenomenon called electromigration. This electromigration phenomenon causes a situation where a conduction electron flow in a metal gradually sweeps away metallic atoms and therefore wires are deformed, short-circuited, and broken. By forming a write line and a bit line doubling as a write line using materials whose main ingredients are copper, it becomes possible to suppress the short circuit and breaking of the wires due to the electromigration phenomenon. In this embodiment, the bit line doubling as a write line and the write line are formed using materials whose main ingredients are copper, so that the reliability of current flowing during information writing is not impaired and it is possible to have a memory element operate with stability for a long period.

Further, by using SiGe to form the channel portion of the field effect type transistor constituting a memory cell or by applying a SOI (Silicon On Insulator) technique to the production of a substrate, it becomes possible to have the memory cell operate at a higher speed than a memory cell having an ordinary MOS structure and to shorten an access time of a memory element. When this memory element was produced using a field effect type transistor having an SiGe channel and was operated, the access time was shortened by about 10%. Here, the SOI technique means the formation of a three-dimensional integrated circuit by forming a thin Si film on an insulating film and forming an MOS integrated circuit in this Si film. With the SOI technique, it becomes possible to reduce the parasitic capacitance of a substrate that hinders the acceleration of an MOS transistor.

<Sixth Embodiment>

In this embodiment, a memory cell was produced using a ferrimagnetic substance made of a GdFe base rare-earth transition metal alloy as magnetic films of a TMR element. Here, this memory cell was produced so as to be magnetized vertically with reference to the film planes of magnetic films. Also, the memory cell was produced by grounding a bit line in order to suppress or attenuate noise generated in the bit line. Other preferable materials of the magnetic films that are magnetized in the film plane vertical direction are TbFe, GdFeCo, TbFeCo, and the like. It is preferable that a magnetic film including Gd having a relatively small coercive force is used as the soft layer and a magnetic film including Tb is used as the hard layer because it becomes easy to adjust the coercive force.

The memory cell of this embodiment was brought into a differential reading operation and it was confirmed that the time taken to attenuate noise i was reduced to around ⅕ of that in the case of a conventional memory cell including no mechanism for suppressing or attenuating noise generated in a bit line.

This embodiment enables the suppression or attenuation of noise generated in a bit line of a nonvolatile solid-state magnetic memory (1T1R type MRAM). As a result, it is possible for the magnetic memory of this embodiment to perform a reading operation with stability.

<Seventh Embodiment>

By applying a nonvolatile solid-state magnetic memory chip according to the present invention to a portable information processing apparatus, such as a portable communication device or a personal computer device, it becomes possible to provide a memory function that is stable even under a usage condition where power supply is unstable. This is because the nonvolatile solid-state magnetic memory chip according to the present invention has the so-called nonvolatile function of retaining information even if power supply is interrupted. Also, by using a memory element according to the present invention in place of a conventional SRAM (Static Random Access Memory) used as a work memory by backing up information in the SRAM using a battery, the battery for backup becomes unnecessary. This largely contributes to the cost reduction and the miniaturization of an apparatus. Further, by using the memory element according to the present invention that is capable of rewriting information at several digits higher speed in place of an NOR type flash memory used as a program memory, there is dramatically improved the throughput of a portable information processing apparatus, such as a portable communication device, a portable personal computer, or the like.

The following description concerns a memory chip and portable information processing apparatus to which the nonvolatile solid-state magnetic memory is applied.

For instance, a memory chip which is given to an EEPROM (Electrical Erasable and Programmable ROM)-compatible driving circuit, is mounted on a lead frame (a metallic product having a single frame structure and including a chip mounting portion, an inner lead portion of wire bonding and an outer lead portion for soldering onto a substrate), and is sealed within a ceramic package. It is possible for the memory element produced in this manner to operate normally even after subjected to stress for one hour at 40° C.

Also, it is possible to construct an embedded type magnetic memory chip by arranging, on the same chip, the foregoing nonvolatile solid-state magnetic memory, a control circuit (including 8-bit microprocessor and the like) for controlling the writing of information into and the reading of information from the nonvolatile solid-state magnetic memory, and other various circuits.

Next is described a portable information processing apparatus constructed using the nonvolatile memory of nonvolatile solid-state magnetic memory of this embodiment as a program storing memory. In this apparatus, a control circuit operates according to a program stored in the program storing memory. By way of example, the outline of the construction of the portable information processing apparatus including a communication function is shown in FIG. 43.

Figure 43:
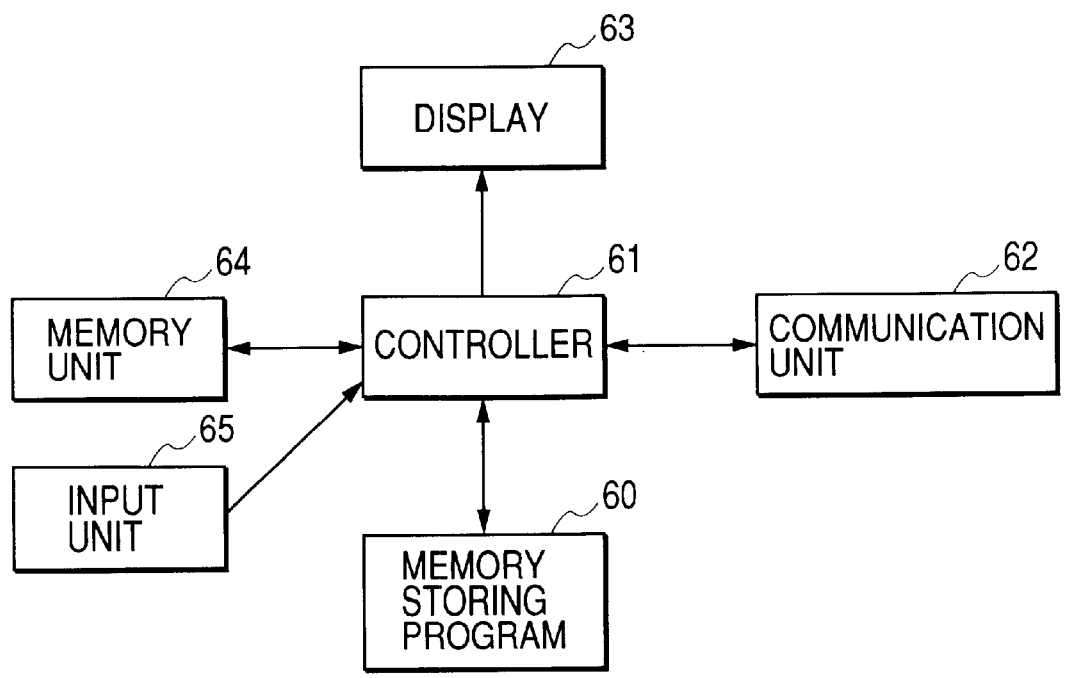
FIG. 43 is a block diagram showing the outline of the structure of a portable information processing apparatus that uses a nonvolatile solid-state magnetic memory of the present invention and has a communication function.

In FIG. 43, the portable information processing apparatus includes a program storing memory 60 in which a predetermined program is stored, a control unit 61 that operates according to the program stored in the program storing memory 60, a communication unit 62 capable of transmitting and receiving information via a wire line (a public network like a telephone line, ISDN, or the like) or a wireless line, a display 63 that is a liquid crystal display or the like, a memory unit 64, and an input unit 65 such as a keyboard. The control unit 61 exchanges information with an external information terminal via the communication unit 62 and displays information on the display 63. The control unit 61 is also capable of storing calculation results in the memory unit 64. The control unit 61 is further capable of performing various processing operations and control operations according to the inputs from the input unit 65. By means of the calculation and control operations performed by the control unit 61, there is realized an apparatus having functions that are similar to those of an existing personal computer.

It is possible for this portable information processing apparatus, which uses the nonvolatile solid-state magnetic memory as a program storing memory, to realize performance that is almost the same as that in the case where a DRAM is used.

It should be noted here that in the portable information processing apparatus described above, like the program storing memory 60, the memory unit 64 may also be constructed using the nonvolatile solid-state magnetic memory according to the present invention.

What is claimed is:

1. An information recording and reproducing method for a magnetic memory including a variable resistor having a first magnetic layer for storing information on a basis of a direction of magnetization, a non-magnetic layer, and a second magnetic layer having a coercive force that is smaller than a coercive force of the first magnetic layer, the variable resistor exhibiting different resistances according to magnetization directions of the first magnetic layer and the second magnetic layer, the information recording and reproducing method comprising the steps of:
  initializing the second magnetic layer in a first magnetization direction;
  detecting a resistance value of the variable resistor and holding the detected resistance value as a first resistance value;
  detecting a second resistance value by reversing magnetization of the second magnetization layer in a second magnetization direction and comparing the first resistance value with the second resistance value; and reproducing information according to a result of the comparison.

2. An information recording and reproducing method according to claim 1, wherein the non-magnetic layer is an insulator.

3. An information recording and reproducing method according to claim 1, wherein each magnetic layer is a vertical magnetization film.

4. A magnetic memory comprising:

a variable resistor including a first magnetic layer for storing information on a basis of a direction of magnetization, a non-magnetic layer, and a second magnetic layer having a coercive force that is smaller than a coercive force of the first magnetic layer, the variable resistor exhibiting different resistances according to magnetization directions of the first magnetic layer and the second magnetic layer;

a magnetic field generating means for initializing magnetization of the second magnetic layer and reversing the initialized magnetization;

a circuit for detecting a resistance value of the variable resistor;

a storage circuit of holding the detected resistance value; and a signal detecting circuit for outputting a reproduction signal by comparing the held resistance value with a resistance value of the variable resistor obtained after the magnetization of the second magnetic layer is reversed from a magnetization state corresponding to the held resistance value.

5. A magnetic memory according to claim 4 further comprising:

a plurality of bit lines that are parallel to each other;

a plurality of word lines that are parallel to each other and are perpendicular to the bit lines; and a switching element having at least two terminals, one of the terminals being connected to a word line, wherein the variable resistor and the switching element are provided for each intersection of the bit lines and the word lines, and one of terminals of the variable resistor is connected to the other of the terminals of the switching element, and the other of the terminals of the variable resistor is connected to a bit line.

6. A magnetic memory according to claim 5, wherein the switching element is constructed using a field effect type transistor formed on a semiconductor substrate, a gate terminal being connected to the word line, one of a source terminal and a drain terminal being connected to the variable resistor, and the other of the source terminal and the drain terminal being grounded.

7. A magnetic memory according to claim 6, wherein the semiconductor substrate is a silicon single crystal substrate.

8. A magnetic memory according to claim 5, wherein the switching element is constructed using a diode formed on a semiconductor substrate.

9. A magnetic memory according to claim 5, wherein the switching element is a thin film transistor.

10. A magnetic memory according to claim 5, wherein the signal detecting circuit and the storage circuit are provided for each of the bit lines.

11. A magnetic memory according to claim 10, wherein the signal detecting circuit includes a sense amplifier, and detects information by inputting a potential of the corresponding bit line obtained in the initialized state into one of terminals of the sense amplifier, inputting a potential of the corresponding bit line obtained after the reversal into the other of the terminals of the sense amplifier, and comparing the potentials of the two terminals.

12. A magnetic memory according to claim 11, wherein the storage circuit is a capacitor that is provided between a ground potential and one of the terminals of the sense amplifier into which the potential of the corresponding bit line obtained at least in the initialized state is inputted.

13. A magnetic memory according to claim 12, wherein a capacitor is further provided between the ground potential and the other of the terminals of the sense amplifier.

14. A magnetic memory according to claim 13, wherein a capacitance of each capacitor is larger than a parasitic capacitance of a wiring of the sense amplifier.

15. A magnetic memory according to claim 5 further comprising a plurality of write lines that are arranged parallel to the word lines, wherein the magnetic field generating means applies a magnetic field to a desired variable resistor by having a current flow through a write line.

16. A magnetic memory according to claim 4, wherein the non-magnetic layer is an insulator.

17. A magnetic memory according to claim 4, wherein the non-magnetic layer is an electric conductor.

18. A magnetic memory according to claim 4, wherein each magnetic layer has vertical magnetization with reference to a film plane.

19. A magnetic memory according to claim 4, wherein each magnetic layer has horizontal magnetization with reference to a film plane.

20. A magnetic memory according to claim 4, wherein a control circuit for controlling an operation for writing information into the magnetic memory and an operation for reading the information from the magnetic memory is formed on the same substrate.

21. A nonvolatile solid-state magnetic memory comprising:

a magneto-resistance element having a first magnetic layer, a second magnetic layer whose coercive force is smaller than a coercive force of the first magnetic layer, and a non-magnetic layer sandwiched between the first magnetic layer and the second magnetic layer, the magneto-resistance element exhibiting different resistances according to magnetization directions of the first magnetic layer and the second magnetic layer;

a bit line connected to one end of the magneto-resistance element;

a sense amplifier that compares a first potential and a second potential, the first potential being generated in the bit line if the first magnetic layer and the second magnetic layer are magnetized parallel to each other in the same direction, the second potential being generated in the bit line if the first magnetic layer and the second magnetic layer are magnetized parallel to each other in an opposite direction; and a noise eliminating means for eliminating noise generated in the bit line when the magnetization direction of the second magnetic layer is reversed.

22. A nonvolatile solid-state magnetic memory according to claim 21,
wherein the noise eliminating means includes a switching means for electrically floating the bit line when the magnetization direction of the second magnetic layer is reversed.

23. A nonvolatile solid-state magnetic memory according to claim 22,
wherein the switching means includes:
a first semiconductor switch provided for one end of the bit line; and
a second semiconductor switch and a third semiconductor switch that are respectively provided for two lines that each connect the other end of the bit line with one of two input terminals of the sense amplifier.

24. A nonvolatile solid-state magnetic memory according to claim 22,
wherein the noise eliminating means is constructed using a semiconductor switch whose one end is connected to the bit line and the other end is grounded.

25. A nonvolatile solid-state magnetic memory according to claim 22,
wherein the noise eliminating means includes a coil connected to the bit line in series.

26. A nonvolatile solid-state magnetic memory according to claim 22,
wherein a unit cell is formed by the magneto-resistance element and one semiconductor switching element.

27. A nonvolatile solid-state magnetic memory according to claim 26,
wherein the semiconductor switching element is a field effect type transistor whose drain terminal is connected to one end of the magneto-resistance element and source terminal is grounded, the drain terminal and the source terminal being electrically connected to each other by application of a predetermined voltage to a gate terminal.

28. A nonvolatile solid-state magnetic memory according to claim 26,
wherein the semiconductor switching element is a field effect type transistor having a channel region whose main material is SiGe.

29. A nonvolatile solid-state magnetic memory according to claim 26,
wherein a substrate on which the semiconductor switching element is formed is an SOI substrate.

30. A nonvolatile solid-state magnetic memory according to claim 22, wherein:
each of the first magnetic layer and the second magnetic layer has an axis of easy magnetization in a predetermined direction;
a part of the bit line is positioned immediately above the first magnetic layer;
a write line is provided so as to pass near the second magnetic layer;
the first magnetic layer is magnetized in a predetermined direction along the axis of easy magnetization by a magnetic field generated by having currents flow through both of the bit line and the write line; and
the second magnetic layer is magnetized in a predetermined direction along the axis of easy magnetization by a magnetic field generated by having a current flow through the bit line.

31. A nonvolatile solid-state magnetic memory according to claim 30,
wherein at least one of the bit line and the write line is made of a material whose main ingredient is copper.

32. A nonvolatile solid-state magnetic memory according to claim 22,
wherein the magneto-resistance element is constructed using a tunnel magneto-resistance element.

33. A nonvolatile solid-state magnetic memory according to claim 32,
wherein each magnetic layer is magnetized in a horizontal direction with reference to a film plane.

34. A nonvolatile solid-state magnetic memory according to claim 32,
wherein each magnetic layer is magnetized in a vertical direction with reference to a film plane.

35. An information reproducing method for a nonvolatile solid-state magnetic memory including a first magnetic layer, a second magnetic layer whose coercive force is smaller than a coercive force of the first magnetic layer, and a magneto-resistance element in which 1-bit information is stored according to magnetization directions of the first magnetic layer and the second magnetic layer, the maganeto-resistance element being connected to a line that is supplied with a predetermined current,
the information reproducing method comprising the steps of:
reading the information stored in the magneto-resistance element by comparing a first potential and a second potential, the first potential being generated in the bit line if the first magnetic layer and the second magnetic layer are magnetized parallel to each other in the same direction, the second potential being generated in the bit line if the first magnetic layer and the second magnetic layer are magnetized parallel to each other in an opposite direction; and
electrically floating the bit line when the magnetization direction of the second magnetization layer is reversed.

36. An information reproducing method for a nonvolatile solid-state magnetic memory including a first magnetic layer, a second magnetic layer whose coercive force is smaller than a coercive force of the first magnetic layer, a non-magnetic layer sandwiched between the first magnetic layer and the second magnetic layer, and a magneto-resistance element that exhibits different resistances according to magnetization directions of the first magnetic layer and the second magnetic layer, the magneto-resistance element being connected to a bit line,
the information reproducing method comprising the steps of:
reading information stored in the magneto-resistance element by comparing a first potential and a second potential, the first potential being generated in the bit line if the first magnetic layer and the second magnetic layer are magnetized parallel to each other in the same direction, the second potential being generated in the bit line if the first magnetic layer and the second magnetic layer are magnetized parallel to each other in an opposite direction; and
grounding the bit line at predetermined impedance when the magnetization direction of the second magnetic layer is reversed.

37. A portable information processing apparatus comprising:

a magnetic memory comprising:
  a variable resistor including a first magnetic layer for storing information on a basis of a direction of magnetization, a non-magnetic layer, and a second magnetic layer having a coercive force that is smaller than a coercive force of the first magnetic layer, the variable resistor exhibiting different resistances according to magnetization directions of the first magnetic layer and the second magnetic layer;
  a magnetic field generating means for initializing magnetization of the second magnetic layer and reversing the initialized magnetization;
  a circuit for detecting a resistance value of the variable resistor;
  a storage circuit of holding the detected resistance value; and
  a signal detecting circuit for outputting a reproduction signal by comparing the held resistance value with a resistance value of the variable resistor obtained after the magnetization of the second magnetic layer is reversed from a magnetization state corresponding to the held resistance value; and
 a control means that operates according to a program stored in the memory.

38. A portable information processing apparatus according to claim 37 further comprising:
  a communication means that is capable of transmitting and receiving information via one of a wired line and a wireless line,
  wherein the control means controls the information transmission and the information reception by the communication means.

39. An information recording and reproducing method for a nonvoltaic memory including a variable resistor for storing information, the variable resistor exhibiting at least two different resistance values, the information recording and reproducing method comprising the steps of:
  initializing a resistance of the variable resistor in a first state;
  detecting a resistance value of the first state of the variable resistor and holding the detected resistance value as a first resistance value;
  detecting a second resistance value by changing from the first state to a second state of the variable resistor and comparing the first resistance value with the second resistance value; and
  reproducing information according to a result of the comparison.

40. A nonvoltaic memory comprising:
  a variable resistor for storing information on a basis of a resistance value, the variable resistor exhibiting at least two different resistance values;
  a recording means for initializing a resistance of the variable resistor to a first resistance value and changing from the first resistance value to a second resistance value;
  a circuit for detecting a resistance value of the variable resistor;
  a storage circuit of holding the detected resistance value; and
  a signal detecting circuit for outputting a reproduction signal by comparing the first resistance value with the second resistance value.

41. A memory according to claim 40, further comprising:
  a plurality of bit lines that are parallel to each other.

42. A memory according to claim 41, wherein said signal detecting circuit comprising a sense amplifier and comparing a first potential which is based on the first resistance value generated in the bit line and a second potential which is based on the second resistance value generated in the bit line,
  and a noise eliminating means for eliminating noise generated in the bit line when the resistance value of the variable resistor is changed.

43. A memory according to claim 42, wherein the noise eliminating means includes a switching means for electrically floating the bit line when the resistance value of variable resistor is changed.

44. An information reproducing method for a nonvoltaic solid-state memory including a variable resistor exhibiting at least two different resistance values, the information reproducing method comprising:
  reading first resistance and second resistance values of the variable resistor;
  comparing the first and second resistance values of the variable resistor; and
  electrically floating the bit line when the resistance value of the variable resistor is changed.

* * * * *

UNITED STATES PATENT AND TRADEMARK OFFICE
CERTIFICATE OF CORRECTION

PATENT NO. : 6,587,370 B2
DATED : July 1, 2003
INVENTOR(S) : Tadahiko Hirai

It is certified that error appears in the above-identified patent and that said Letters Patent is hereby corrected as shown below:

Column 3,
Line 21, "in a" should read -- in an --.

Column 7,
Line 40, "TWL1,' TWL2,'" should read -- TWL1', TWL2', --.

Column 9,
Line 6, "lines" should read -- line --.

Column 11,
Line 65, "AV" should read -- $\Delta V$ --.

Column 16,
Line 43, "AV" should read -- $\Delta V$ --.

Column 18,
Line 5, "a control units" should read -- a control unit --.

Column 25,
Line 48, "one of" should read -- one of the --.

Column 28,
Line 26, "line" should read -- bit line --.

Signed and Sealed this

Twenty-third Day of December, 2003

JAMES E. ROGAN
*Director of the United States Patent and Trademark Office*